US012745681B2

(12) United States Patent
Ni et al.

(10) Patent No.: US 12,745,681 B2
(45) Date of Patent: Sep. 22, 2026

(54) CHIP SINGULATION ASSISTED STRUCTURES AND METHODS FOR IMPROVING BONDING INTERFACE QUALITY

(71) Applicant: Apple Inc., Cupertino, CA (US)

(72) Inventors: Chi Nung Ni, Foster City, CA (US); Wei Chen, San Jose, CA (US); Weiming Chris Chen, Hsinchu City (TW); Vidhya Ramachandran, Cupertino, CA (US); Jie-Hua Zhao, Cupertino, CA (US); Suk-Kyu Ryu, Cupertino, CA (US); Myung Jin Yim, San Jose, CA (US); Chih-Ming Chung, Cupertino, CA (US); Jun Zhai, Cupertino, CA (US); Young Doo Jeon, San Jose, CA (US); Seungjae Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 284 days.

(21) Appl. No.: 18/598,938

(22) Filed: Mar. 7, 2024

(65) Prior Publication Data

US 2024/0421126 A1 Dec. 19, 2024

Related U.S. Application Data

(60) Provisional application No. 63/508,830, filed on Jun. 16, 2023.

(51) Int. Cl.
*H10W 90/00* (2026.01)
*H10D 62/10* (2025.01)
(Continued)

(52) U.S. Cl.
CPC .......... *H10W 90/00* (2026.01); *H10D 62/117* (2025.01); *H10W 20/43* (2026.01);
(Continued)

(58) Field of Classification Search
CPC ..... H10W 90/00; H10W 20/43; H10W 42/00; H10W 70/611; H10W 70/65;
(Continued)

(56) References Cited

U.S. PATENT DOCUMENTS 8,058,737 B2 11/2011 Hasegawa et al.
10,163,709 B2 * 12/2018 Yu .......................... H10P 54/00
(Continued)

FOREIGN PATENT DOCUMENTS

CN 112385036 A 2/2021
CN 113035823 A 6/2021
(Continued)

OTHER PUBLICATIONS

Heusinger-Jonda et al., "Decapsulation of advanced packages using an atmospheric Oxygen-only plasma enabling true root cause failure analysis" received from https://www.semiconductorpackagingnews.com/uploads/1/Atmospheric_Oxygen-only_Plasma_for_Decapsulation_of_Advanced_Packages.pdf, Published on Sep. 23, 2022, 14 pages.
(Continued)

*Primary Examiner* — Syed I Gheyas
(74) *Attorney, Agent, or Firm* — Aikin & Gallant, LLP

(57) ABSTRACT

Integrated circuit (IC) structures, electronic modules, and methods of fabrication are described in which direct bonded interfaces are removed at corners or edges to counteract the potential for non-bonding or delamination. This can be accomplished during singulation, in which a side recess is formed through an entire thickness of an electronic component and into a direct bonded die, followed by final singulation of the IC structure.

34 Claims, 18 Drawing Sheets

(51) Int. Cl.

| | |
|---|---|
| ***H10W 20/43*** | (2026.01) |
| ***H10W 42/00*** | (2026.01) |
| ***H10W 70/60*** | (2026.01) |
| ***H10W 70/65*** | (2026.01) |
| ***H10W 70/685*** | (2026.01) |
| ***H10W 74/01*** | (2026.01) |
| ***H10W 74/10*** | (2026.01) |
| *H10W 80/00* | (2026.01) |

(52) U.S. Cl.
CPC .......... *H10W 42/00* (2026.01); *H10W 70/611* (2026.01); *H10W 70/65* (2026.01); *H10W 70/685* (2026.01); *H10W 74/01* (2026.01); *H10W 74/131* (2026.01); *H10W 80/312* (2026.01); *H10W 80/327* (2026.01); *H10W 90/792* (2026.01); *H10W 90/794* (2026.01)

(58) Field of Classification Search
CPC . H10W 70/685; H10W 74/01; H10W 74/131; H10W 80/312; H10W 80/327; H10W 90/792; H10W 90/794; H10W 90/297; H10W 90/722; H10W 72/20; H10W 72/90; H10W 90/10; H10W 90/20
See application file for complete search history.

(56) References Cited

U.S. PATENT DOCUMENTS

| | | | |
|---|---|---|---|
| 11,587,800 B2 | 2/2023 | Chiang et al. | |
| 2013/0119556 A1 | 5/2013 | Liu et al. | |
| 2015/0228557 A1 | 8/2015 | Cheng et al. | |
| 2017/0154872 A1 | 6/2017 | Moon et al. | |
| 2018/0090443 A1 | 3/2018 | Lee et al. | |
| 2019/0363079 A1 | 11/2019 | Thei et al. | |
| 2022/0181299 A1* | 6/2022 | Kim | H10D 62/117 |
| 2022/0285303 A1 | 9/2022 | Mirkarimi et al. | |
| 2022/0361338 A1 | 11/2022 | Hsu et al. | |
| 2022/0365295 A1 | 11/2022 | Jiang et al. | |
| 2022/0384378 A1 | 12/2022 | Jang | |
| 2022/0384388 A1* | 12/2022 | Chen | H10W 90/00 |
| 2023/0230882 A1* | 7/2023 | Mao | H10P 54/00 |

FOREIGN PATENT DOCUMENTS

| | | | |
|---|---|---|---|
| CN | 218783021 | U | 3/2023 |
| KR | 20190091146 | A | 8/2019 |
| TW | 201320268 | A1 | 5/2013 |
| TW | 201532223 | A | 8/2015 |
| TW | 202005036 | A | 1/2020 |
| TW | 202238765 | A | 10/2022 |
| TW | 202308100 | A | 2/2023 |

OTHER PUBLICATIONS

Jiaco Instruments, "Decapsulation Technology", received from https://jiaco-instruments.com/decapsulation-technology/, Published Oct. 10, 2018, 4 pages.

Kim et al., "Plasma dicing before grinding process for highly reliable singulation of low-profile and large die sizes in advanced packages", received from https://mnsl-journal.springeropen.com/counter/pdf/10.1186/s40486-023-00183-w.pdf, 7 pages.

Wei et al., "Plasma Dicing Fully Integrated Process-Flows Suitable for Beol Advanced Packaging Fabrications", received from https://ieeexplore.ieee.org/document/7999715/keywords#keywords, May 30, 2017, 8 pages.

PCT/US2024/030410, "PCT Notification of Transmittal of the International Search Report and the Written Opinion of the International Searching Authority, or the Declaration", mailed Sep. 5, 2024, 10 pages.

PCT/US2024/030413, "PCT Notification of Transmittal of the International Search Report and the Written Opinion of the International Searching Authority, or the Declaration", mailed Sep. 6, 2024, 12 pages.

* cited by examiner 171
170
135
d1
130
114

171
170
135
114

131
d1
130
112
114

A
A
B
B
112
112

135
170
162
164
162
164
164
166
112
112
164
164
164

110
131
135
134
138
140
118
152
154
188
194
112
130
186
114
190
142
146
132
144
116
156
158
125
150
192

134
194
188
112
130
186
114
190
132

CHIP SINGULATION ASSISTED STRUCTURES AND METHODS FOR IMPROVING BONDING INTERFACE QUALITY

RELATED APPLICATIONS

This application claims the benefit of priority of U.S. Provisional Application No. 63/508,830, filed Jun. 16, 2023, which is herein incorporated by reference.

BACKGROUND

Field

Embodiments described herein relate to semiconductor packaging, and more particularly to molding of directly bonded structures.

Background Information

The current market demand for portable and mobile electronic devices such as mobile phones, personal digital assistants (PDAs), digital cameras, portable players, augmented reality/virtual reality (AR/VR) headsets, gaming, and other mobile devices requires the integration of more performance and features into increasingly smaller spaces. As a result, various multiple-die packaging solutions such as system in package (SiP) and package on package (POP) have become more popular to meet the demand for higher die/component density devices.

There are many different possibilities for arranging multiple dies in an SiP. For example, vertical integration of die in SiP structures has evolved into 2.5D solutions and 3D solutions. In 2.5D solutions the multiple dies may be flip chip bonded on an interposer that may include through vias as well as fan out wiring. Various 3D solutions exist. In one implementation multiple dies may be stacked on top of one another on an SiP substrate, and connected with off-chip wire bonds or solder bumps. In other traditional 3D solutions hybrid bonding using wafer on wafer (WoW) or chip on wafer (CoW) techniques is utilized. In a WoW solution, the top and bottom device area dimensions are exactly matched, and each layer is restricted to one technology node. In a CoW solution multiple top wafers (chips) can be integrated onto the same bottom wafer with defined area and technology node.

Hybrid bonding including metal-metal and oxide-oxide bonding has generally been adopted as a suitable technology for mass production of high-density input/output (I/O) chips with ultra-small pad pitches. A traditional hybrid bonding sequence includes three main operations including oxide-to-oxide initial bonding at room temperature, heating to close dishing gap, and then further heating to compress metal-to-metal bonds. After the hybrid bonding process there can be follow up processing and device finishing operations depending upon the particular application. Modern integrated circuit (IC) fabrication techniques commonly utilize gap fill material such as dielectric materials (e.g., chemical vapor deposition oxide or nitrides) or epoxy molding compound to encapsulate the hybrid bonded dies for various reasons including to protect brittle material from mechanical damage and to smooth out a surface to facilitate downstream wafer-level processing.

SUMMARY

Integrated circuit (IC) structures, electronic modules, and methods of fabrication are described in which direct bonded interfaces can be removed in regions, such as at die corners or edges, that are at high-risk for non-bonding or delamination. This may be accomplished with dicing methods, and in particular with a combination of grooving (e.g., laser, plasma, stealth etching) and mechanical sawing. In an embodiment, and IC structure includes an electronic component (e.g., die, interposer, etc.) and one or more dies bonded directly to the electronic component. The dies which are bonded directly to the electronic component can themselves be single-layer die or multi-stacked dies (bonded dies). A side recess is formed in at least one of the dies and extends through an entire thickness of the electronic component and into the die. In an embodiment, the side recess defines a recess sidewall extending through the entire thickness of the electronic component and a recess roof within the die, and the recess roof intersects with an outermost lateral sidewall of the die such that the outermost lateral sidewall is exterior to the recess sidewall. A variation of the grooving process is that one or more localized cavities can be formed through the electronic component and into the die interior to the external edges of the singulated IC structure. In this case, the localized cavities can be placed further within the die and not limited to be applied to die corner and/or edges. The side recesses and/or localized cavities may be filled prior to singulation of the IC structures or optionally filled in the downstream assembly processes.

DETAILED DESCRIPTION

Figure 1A:
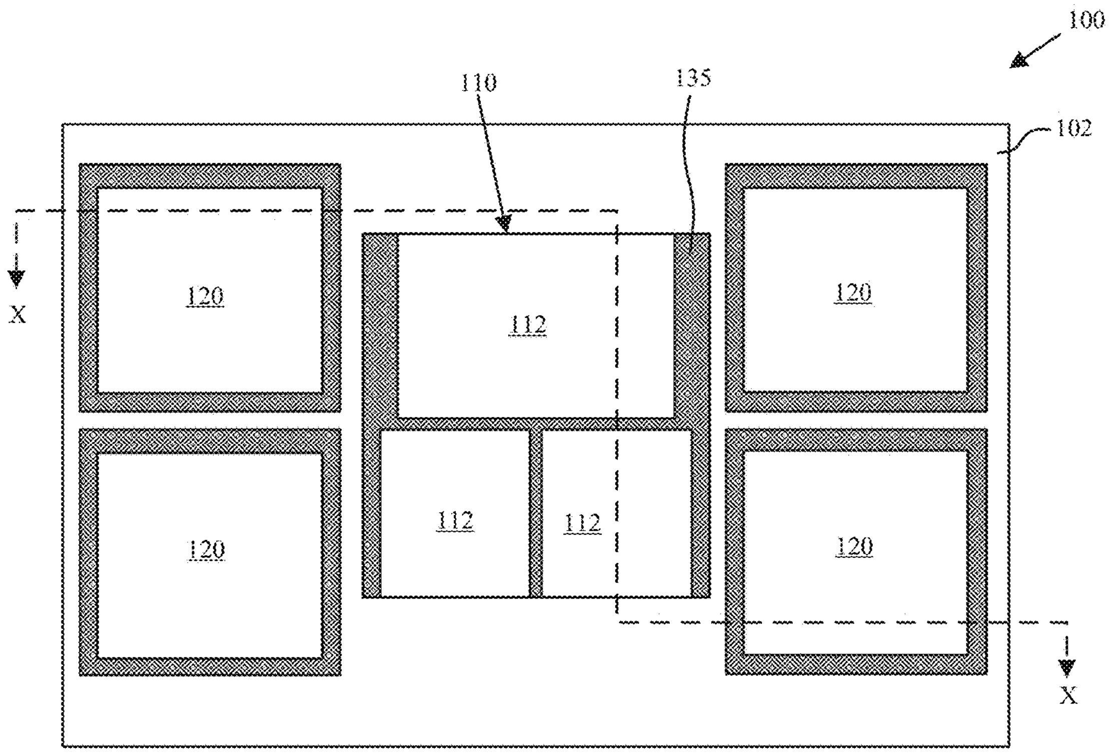
FIG. 1A is a schematic top view illustration of an electronic module including an IC structure with a die directly bonded to an electronic component in accordance with an embodiment.

Embodiments describe integrated circuit (IC) structures, electronic modules, and methods of fabrication. In an embodiment, an IC structure includes an electronic component that includes a first bonding surface, and a die that includes a second bonding surface bonded directly to the first bonding surface (e.g., with hybrid bonding or fusion bonding). A side recess extends through an entire thickness of the electronic component and into the die, and defining a recess sidewall that extends through the entire thickness of the electronic component and a recess roof within the die. The recess roof in accordance with embodiments intersects with an outermost lateral sidewall of the die such the outermost lateral sidewall is exterior to the recess sidewall. The recess roof may further extend through a gap fill material (e.g., molding compound) that laterally surrounds the die.

In one aspect, it has been observed that molding compound material such as epoxy molding compound (EMC) has a much lower elastic modulus and higher coefficient of thermal expansion (CTE) than the die(s) it encapsulates, and this change in clastic modulus and CTE from the bonded die(s) to the surrounding EMC can cause high stress concentrations near the die edges and corners of the bonding interface. In particular high peeling stress concentrations may form when the bonded structure is trying to bend due to thermal or mechanical loadings, such as with EMC expansion at elevated temperatures. Additionally, high shear stress concentrations may form as the bonded structure tries to shrink or expand together with other packaging and system components (e.g., substrate, printed circuit board, etc.).

In another aspect it has been observed that an incoming die may have a certain level of intrinsic warpage due to residual stress in a back-end-of-the-line (BEOL) build-up structure and bonding interface layer material that is used for fusion or hybrid bonding. It has been observed that it can be challenging to flatten the die edges and corners during direct bonding processes such as fusion and hybrid bonding.

In accordance with embodiments, the bonded interface can be removed in high-risk regions such as at die corners and edges. This may be accomplished with dicing methods, and in particular with a combination of grooving (e.g., laser, plasma, stealth etching) and mechanical sawing to remove the high-risk regions for non-bonding or delamination.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 1B:
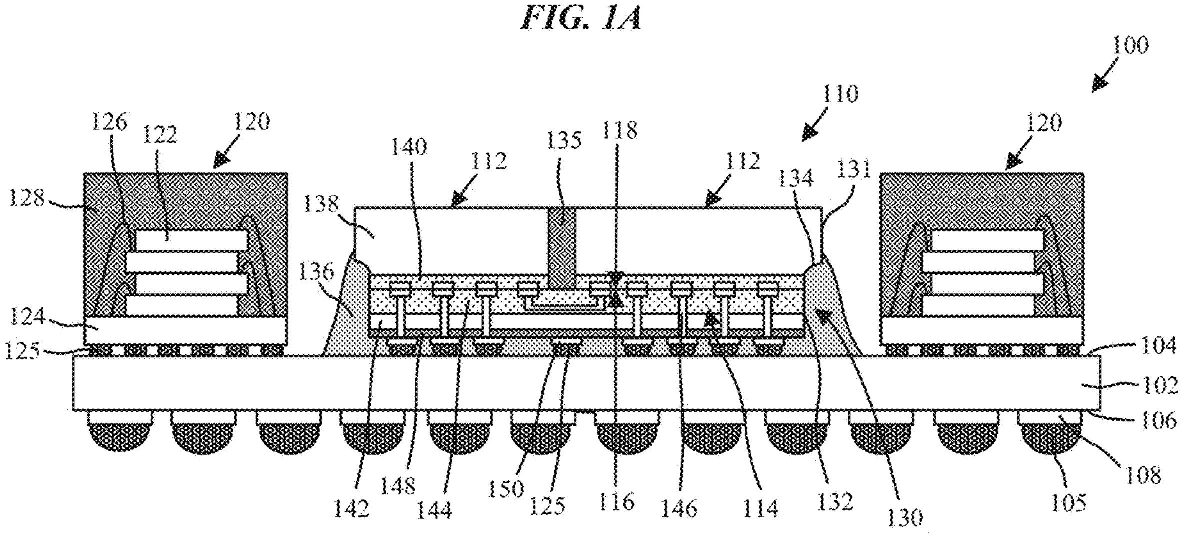
FIG. 1B is a schematic cross-sectional side view illustration taken along line X-X of FIG. 1A in accordance with an embodiment.

Referring now to FIGS. 1A-1B, FIG. 1A is a schematic top view illustration of an electronic module including an IC structure with a die directly bonded to an electronic component in accordance with an embodiment; FIG. 1B is a schematic cross-sectional side view illustration taken along line X-X of FIG. 1A in accordance with an embodiment. As shown, an electronic module 100 can include a module substrate 102, such as a printed circuit board (PCB), interposer, etc., and an integrated circuit (IC) structure 110 mounted on the module substrate 102. Additional electronic components 120 may also be mounted on module substrate 102.

The IC structure 110 in accordance with embodiments can include a plurality of dies 112 that can be the same or different type. Various exemplary dies 112 include system-on-chip (SOC), graphics processing unit (GPU), central processing unit (CPU), artificial intelligence (AI), machine learning logic, radio-frequency (RF) baseband processor, radio-frequency (RF) antenna, signal processors, power management integrated circuit (PMIC), logic, memory, photonics, biochips, low speed and/or high speed input/output (HSIO), cache, a silicon interconnect and any combinations thereof. Dies 112 in accordance with embodiments may be active or passive, and may be an interposer. In accordance with embodiments the dies 112 can be directly bonded to an electronic component 114, which can also be a die or interposer structure. For example, direct bonding may be with fusion bonding (dielectric-dielectric bonds) or hybrid bonding (metal-metal bonds and dielectric-dielectric bonds). The electronic component 114 can include electrical routing, inclusive of die-to-die routing, and vertical routing from the dies 112 to the module substrate 102. The electronic component may optionally include various passive or active devices. In a particular embodiment the dies 112 include multiple CPUs and a GPU, hybrid bonded with an interposer electronic component 114. The IC structure 110 may be connected to multiple memory packages as electronic components 120 and connected through the module substrate 102.

In the exemplary embodiment illustrated in FIG. 1B, the module substrate 102 includes a top surface 104 and bottom surface 106, which may include a plurality of contact pads 108 onto which a plurality solder bumps 105 are placed. The electronic components 120, such as dynamic random access memory (DRAM) packages including stacked DRAM chips 122 connected to package substrate 124 with wire bonds 126 for example. The DRAM chips 122 and wire bonds 126 may be encapsulated in a molding compound 128 on top of the package substrate 124. The electronic components 120 can be mounted onto the module substrate 102 solder bumps 125.

The IC structure 110 in accordance with embodiments includes an electronic component 114 with a first bonding surface 116, and a die 112 including a second bonding surface 118 directly bonded to the first bonding surface 116. A side recess 130 is formed in the IC structure 110 such that it extends through an entire thickness of the electronic component 114 and into the die 112. Specifically, the side recess 130 can define a recess sidewall 132 that extends through the entire thickness of the electronic component 114, and a recess roof 134 within the die 112. The recess roof 134 additionally intersects with an outermost lateral sidewall 131 of the die 112 such that the outermost lateral sidewall is exterior to the recess sidewall 132. The recess roof may be tapered depending upon method of forming the side recess 130. An underfill material 136 (e.g., epoxy, etc.) may additionally be applied between the IC structure 110 and top surface 104 of the module substrate 102. In an embodiment, the underfill material 136 fills the side recess(s) 130.

The dies 112 may be encapsulated in a gap fill material 135, such as an oxide or molding compound (e.g., epoxy). In some embodiments the gap fill material 135 may optionally be removed (at least partially) from one or more sides of the IC structure 110 during formation of the recess sidewall(s) 132 and singulation, as will be described in further detail.

The singulated IC structures 110 in accordance with embodiments may include multi-die chip sets, with the gap fill material 135 filling the spaces laterally between the dies 112, and optionally surrounding one or more edges of the dies 112 depending upon whether the side recesses and singulation proceeds through the dies 112 or gap fill material 135. In accordance with some embodiments, the outermost lateral sidewalls 131 of two dies (e.g., formed after the side recesses 130 and singulation) are parallel to one another, forming opposite edges of the singulated IC structures 110. In other embodiments, the outermost lateral sidewalls 131 of two dies, can be orthogonal to one another when on opposite sides of a corner of the singulated IC structure, or may share the same plane as one another when forming the same edge of the singulated IC structure 110.

Still referring to FIG. 1B, in accordance with embodiments the dies 112 can each include a semiconductor layer 138, and a back-end-of-the-line (BEOL) build-up structure 140 on the semiconductor layer. The semiconductor layer 138 can be a bulk silicon substrate, silicon-on-insulator (SOI) substrate, etc. and may have an epitaxial device layer over bulk silicon. Silicon is exemplary, and other semiconductor substrate materials can be used. The BEOL build-up structure 140 may include electrical routing as is customary, as well as metal sealing structures (e.g., seal rings) to function as both as a physical barrier to moisture and impurity ingress, as well as to provide mechanical integrity.

The electronic component may also include a semiconductor layer 144 and BEOL build-up structure 142. The BEOL build-up structure 142 may include electrical routing, and optionally die-to-die routing between the dies 112. A plurality of through vias 146 (e.g., through silicon vias) can extend through the semiconductor layer 144 and backside dielectric layer 148 to make contact with terminals (e.g., contact pads) 150, onto which solder bumps 125 can be placed.

Figure 2A:
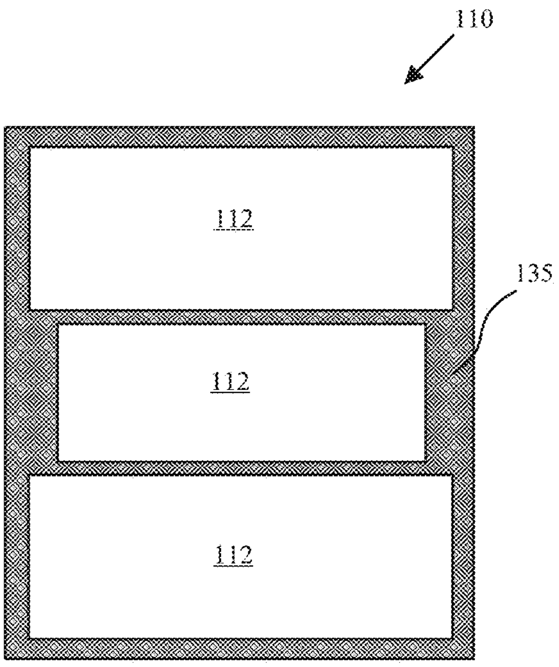
FIGS. 2A-2C are schematic top view illustrations of IC structures with various die arrangements in accordance with an embodiment.
Figure 2B:
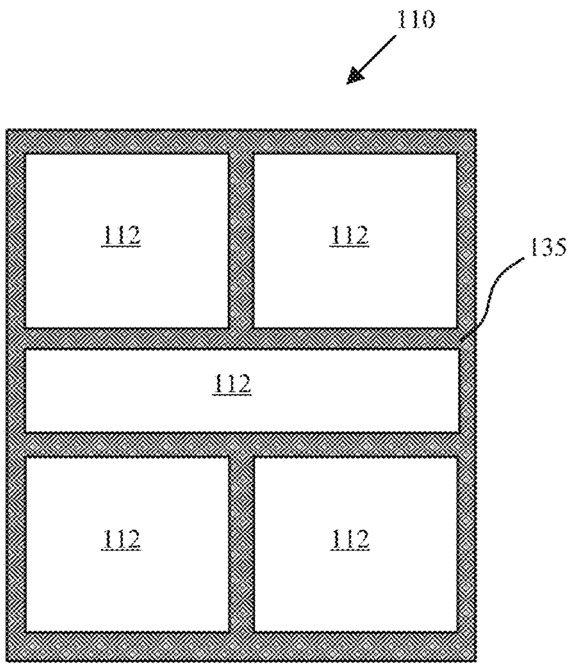
Figure 2C:
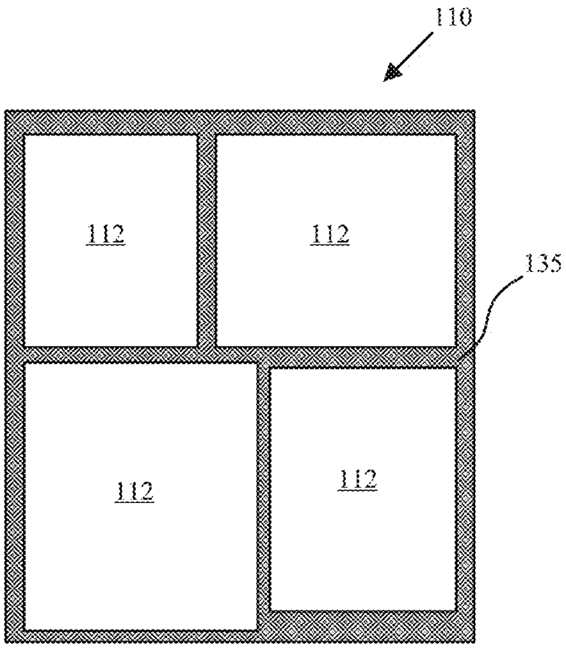

It is to be appreciated that the particular die 112 arrangements within the IC structure 110 illustrated in FIGS. 1A-1B is exemplary and embodiments are not so limited. FIGS. 2A-2C are schematic top view illustrations of IC structures with various die arrangements in accordance with an embodiment. In particular, the embodiments illustrated in FIGS. 2A-2C illustrate molded configurations prior to singulation. A variety of alternative configurations are envisioned.

Figure 3:
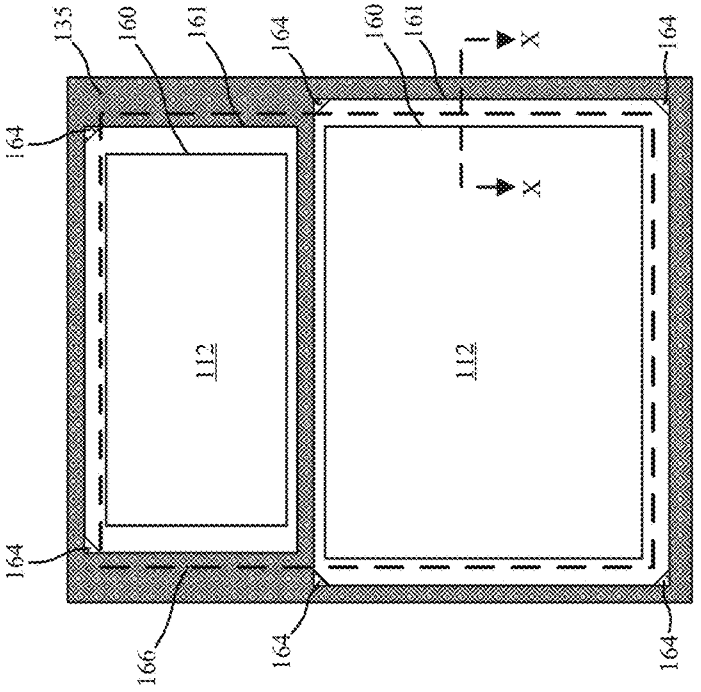
FIG. 3 is a schematic top view illustration of a molded IC structure prior to singulation in accordance with an embodiment.
Figure 4:
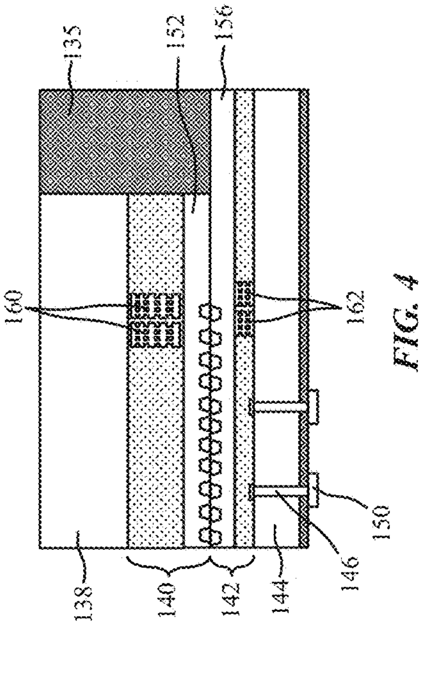
FIG. 4 is a schematic cross-sectional side view illustration taken along line X-X of FIG. 3 in accordance with an embodiment.

Referring now to FIGS. 3-4, FIG. 3 is a schematic top view illustration of a molded IC structure prior to singulation in accordance with an embodiment. FIG. 4 is a schematic cross-sectional side view illustration taken along line X-X of FIG. 3 in accordance with an embodiment. In interest of clarity, a two-die system is illustrated, though embodiments are not so limited. As shown in FIG. 3, the dies 112 include seal ring 160 structures inside their original perimeters 161 (edges). A gap fill material is then formed between and around, and optionally over the dies on top of the electronic component 114. In the particular embodiment shown in FIG. 3, high stress regions 164 are identified near corners of the dies 112. For example, high stress regions 164 may be known from product development and modeling. In accordance with embodiments, these high stress regions 164 can be removed during side recess formation and singulation. An overly for edge singulation is illustrated by the dotted lines along path 166. In this embodiment, IC structure singulation can be through edges of both dies 112.

Referring now to FIG. 4, in the illustrated embodiment the BEOL build-up structure 140 of the die 112 includes a dielectric bonding layer 152 and metal bond pads 154, which are both exposed along the bonding surface 118. Similarly, the BEOL build-up structure 142 of the electronic component 114 may include a dielectric bonding layer 156 and metal bond pads 158, which are both exposed along the bonding surface 116. In a hybrid bonded configuration, the metal bonds pads 54, 158 may be bonded together with metal-metal bonds, and the dielectric bonding layers 152, 156 may be bonded together with dielectric-dielectric bonds (e.g., oxide-oxide bonds).

Figure 5:
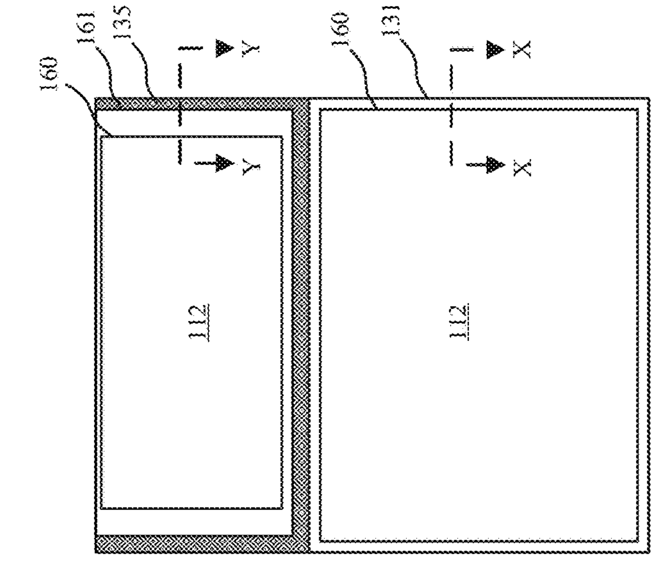
FIG. 5 is a schematic top view illustration of a molded IC structure after singulation in accordance with an embodiment.
Figure 6A:
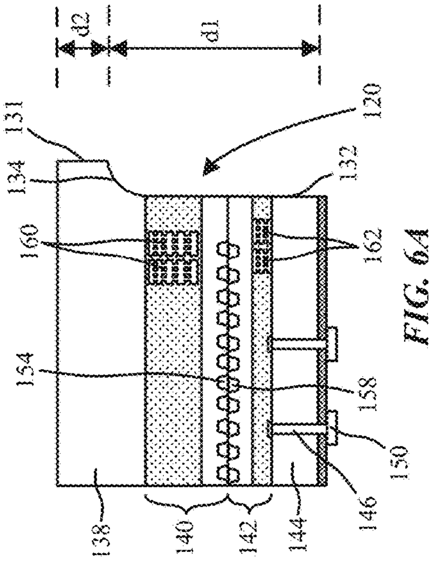
FIG. 6A is a schematic cross-sectional side view illustration taken along line X-X of FIG. 5 in accordance with an embodiment.

Referring now to FIGS. 5-6A schematic top view and cross-sectional side view illustrations are provided of the molded IC structure 110 after singulation along path 166, with FIG. 6A taken along line X-X of FIG. 5 in accordance with an embodiment. As shown, singulation is through a portion of the bottom die 112. In accordance with embodiments, a grooving operation can be performed prior to singulation. The resulting structure shown in FIG. 6A includes a side recess 130 extending through an entire thickness of the electronic component 114 and into the die 112. The side recess 130 defines a recess sidewall 132 extending through the entire thickness of the electronic component and a recess roof 134 within the die 112. The recess roof 134 additionally intersects with an outermost lateral sidewall 131 of the die 112 such the outermost lateral sidewall 131 is exterior to the recess sidewall 132. As described in further detail in the process flow of FIGS. 7A-7E, singulation may include a first operation for forming the side recess 130, such as laser etching (grooving), plasma etching, stealth etching, etc. followed by a second operation for singulation such as sawing, where the outermost lateral sidewall 131 is defined. Thus, the depth (d1) of the side recess 130 can be determined primarily by the first operation, and depth/thickness of the outermost lateral sidewall (d2) is the remainder. The particular embodiment illustrated in FIG. 6A may be indicative of laser etching, wherein a curved recess roof 134 can be formed.

Figures 6B, 6C, 6D, 6E, 6F:
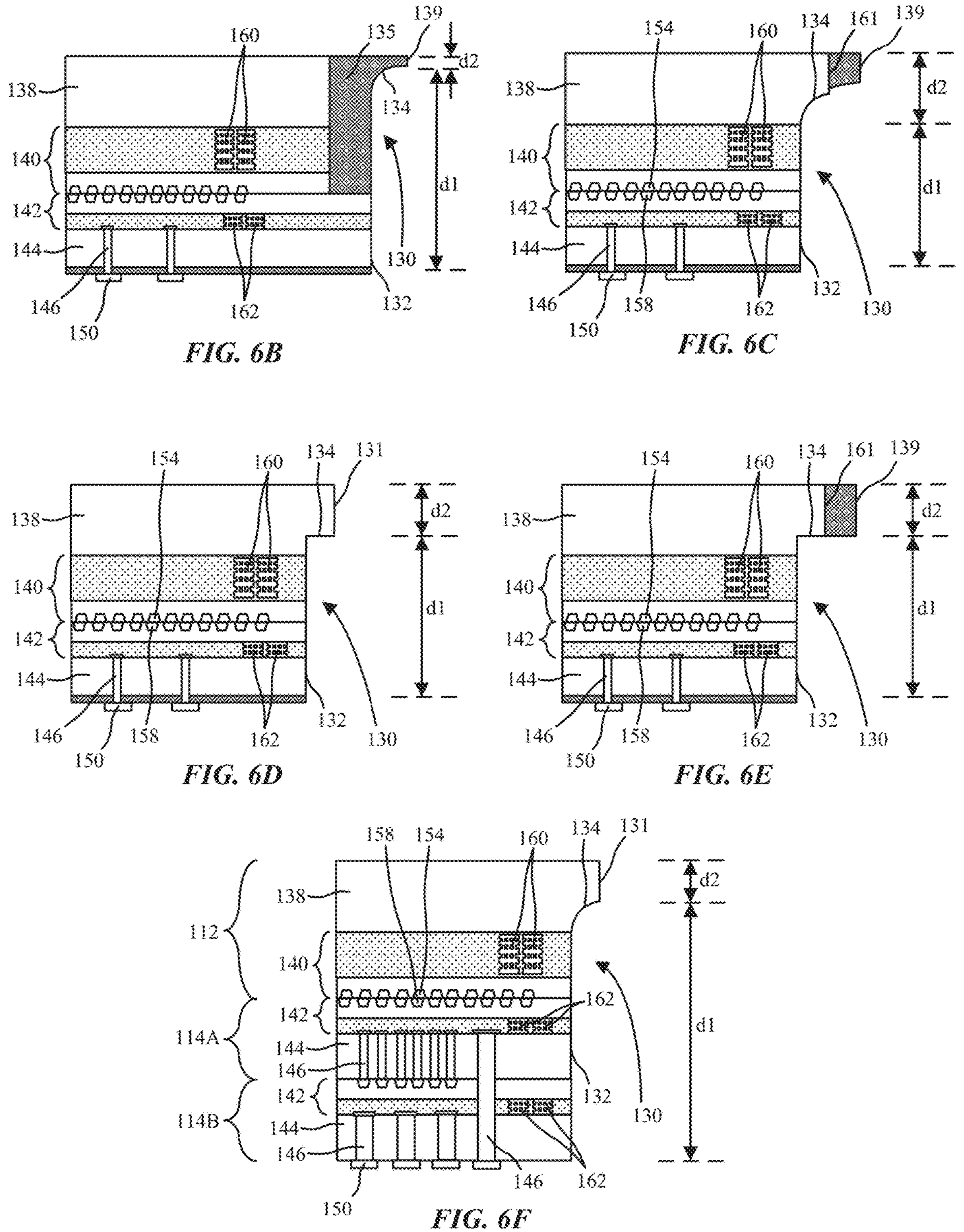
FIG. 6B is a schematic cross-sectional side view illustration taken along line Y-Y of FIG. 5 in accordance with an embodiment.
FIG. 6C is a schematic cross-sectional side view illustration of a recessed configuration in which the singulated outside edge of the IC structure corresponds to the outer edge of the gap fill material in accordance with an embodiment.
FIG. 6D is a schematic cross-sectional side view illustration of a recessed configuration formed by plasma and saw dicing in accordance with an embodiment.
FIG. 6E is a schematic cross-sectional side view illustration of a recessed configuration formed by plasma and saw dicing in which the singulated outside edge of the IC structure corresponds to the outer edge of the gap fill material in accordance with an embodiment.
FIG. 6F is a schematic cross-sectional side view illustration of a recessed configuration formed in a multiple-device stack in accordance with an embodiment.

FIG. 6B is a schematic cross-sectional side view illustration taken along line Y-Y of FIG. 5 in accordance with an embodiment. As shown, the side recess 130 may optionally extend into the gap fill material 135 as well. While side recess 130 formation may be selectively formed along the die(s) 112, the side recesses 130 may also be formed along the entire length of a singulation edge of the IC structure. In such a configuration, the side recess 130 can span within a portion of the gap fill material 135, where depth d1 may be greater than within the dies 112 since the laser may etch the gap fill material 135 at a faster rate than the materials of the dies 112. As such, a depth profile of the side recess 130 along a singulated outside edge of the IC structure may vary depending upon material, with a deeper depth d1 through regions of the gap fill material 135 than dies 112.

While side recesses 130 may be formed into the die 112 in order to remove at-risk bonding interface area, it is not required that singulation of the IC structure 110 also be through the die 112. FIG. 6C is a schematic cross-sectional side view illustration of a recessed configuration in which the singulated outside edge of the IC structure corresponds to the outer edge 139 of the gap fill material 135 in accordance with an embodiment.

Side recess dimensions may be indicative of the manner of formation. For example, laser etching may result in a tapered transition within the recess roof 134 between the recess sidewall 132 and the singulated outside edge of the IC structure. Laser etching may also result in sloped recess sidewalls 132 depending upon the laser grooving recipe. Other fabrication techniques may result in different side recess dimensions. FIG. 6D is a schematic cross-sectional side view illustration of a recessed configuration formed by plasma and/or saw dicing in accordance with an embodiment. In such an embodiment, the recess roof 134 may be substantially flat, and may be orthogonal to the recess sidewall 132. For example, any combination of plasma and saw dicing may be utilized to form the structure of FIG. 6D, such as plasma etching to form the side recess 130, followed by plasma etching or mechanical sawing to singulate the IC structures 110. Alternatively, mechanical sawing can be utilized in for both operations, with a larger blade used for the formation of side recess 130, followed by use of a narrower blade for singulation within the side recess opening. FIG. 6E is a schematic cross-sectional side view illustration of a recessed configuration formed by plasma and saw dicing in which the singulated outside edge of the IC structure corresponds to the outer edge 139 of the gap fill material 135 in accordance with an embodiment.

Up until this point embodiments have been described with regard to a structure including a single electronic component 114 and die 112 direct bonded arrangement. Embodiments may be applicable for a variety of three-dimensional (3D) structures. FIG. 6F is a schematic cross-sectional side view illustration of a recessed configuration formed in a multiple-device stack in accordance with an embodiment. As shown, the configuration may include a plurality of electronic components 114A, 114B, etc. For example, this may be a 3D IC die stack with various through via 146 configurations. The side recess 130 may thus be formed to the appropriate depth through one or more of the electronic components. The depth d1, and recess roof 134 may therefore optionally terminate within an electronic component of such a stack, rather than within a top die 112. Any of the embodiments described herein may be implemented with such a multiple-device stack, which could include additional electronic components or dies.

Figure 7A:
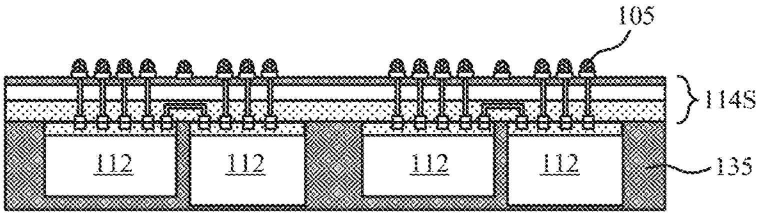
FIGS. 7A-7E are schematic cross-sectional side view illustrations for a method of forming an IC structure with side recesses in accordance with an embodiment.
Figure 7B:
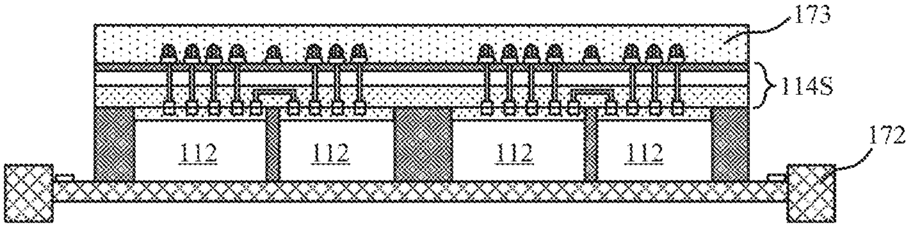
Figure 7C:
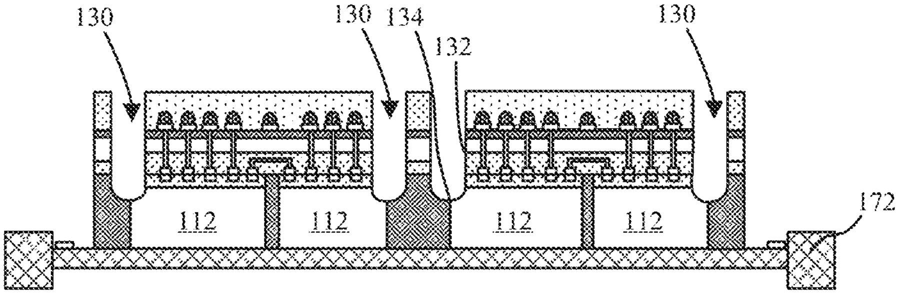

FIGS. 7A-7E are schematic cross-sectional side view illustrations for a method of forming an IC structure with side recesses in accordance with an embodiment. As shown in FIG. 7A the sequence may begin with directly bonding (e.g., fusion bonding, hybrid bonding) dies 112 to an electronic component substrate 114S, which may be at the wafer scale. The dies 112 can then be encapsulated on the electronic component substrate 114S with a gap fill material 135, such as molding compound. The dies 112 and gap fill material 135 may then be optionally thinned using a griding method, followed by application of solder bumps 105 on the electronic component substrate 114S. A tape 173 (e.g., ball grid tape) can then be applied to the solder bumps 105 and transferred to a frame 172 as shown in FIG. 7B. Referring to FIG. 7C, a plurality of side recesses 130 are then formed through an entire thickness of the electronic component substrate 114S and into the dies 112 with the side recesses defining recess sidewalls 132 and recess roofs 134 within the dies 112. Notably, the recess roofs 134 may also extend in the gap fill material 135. In an embodiment laser drilling, or grooving, may be used to form the side recesses 130. Other techniques can also be used such as plasma etching, stealth etching, etc.

Figure 7D:
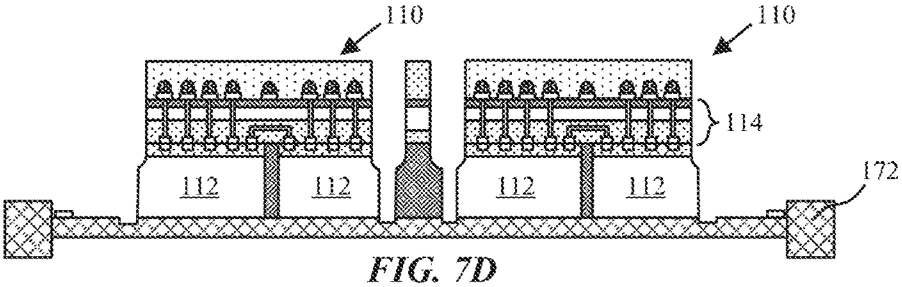
Figure 7E:
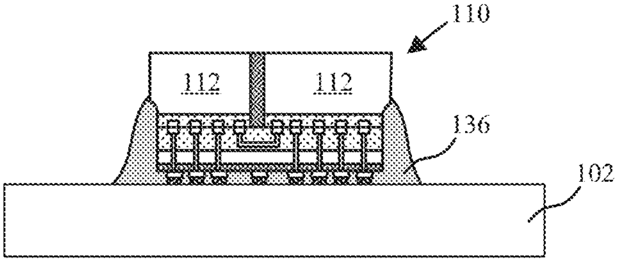

A sawing operation is then performed as shown in FIG. 7D, where sawing is performed through the side recesses 130 to singulate the IC structures 110. In the illustrated embodiment sawing can be performed through a portion of the dies 112 to create the outermost lateral sidewalls of the dies. In other embodiments sawing can be performed through the gap fill material 135 such that a portion of the gap fill material 135 remains around the original die 112 edge(s) after singulation. Following singulation, tape 173 can be removed followed by mounting of the IC structures 110 onto a module substrate 102, for example, as shown in FIG. 7E.

Figure 8A:
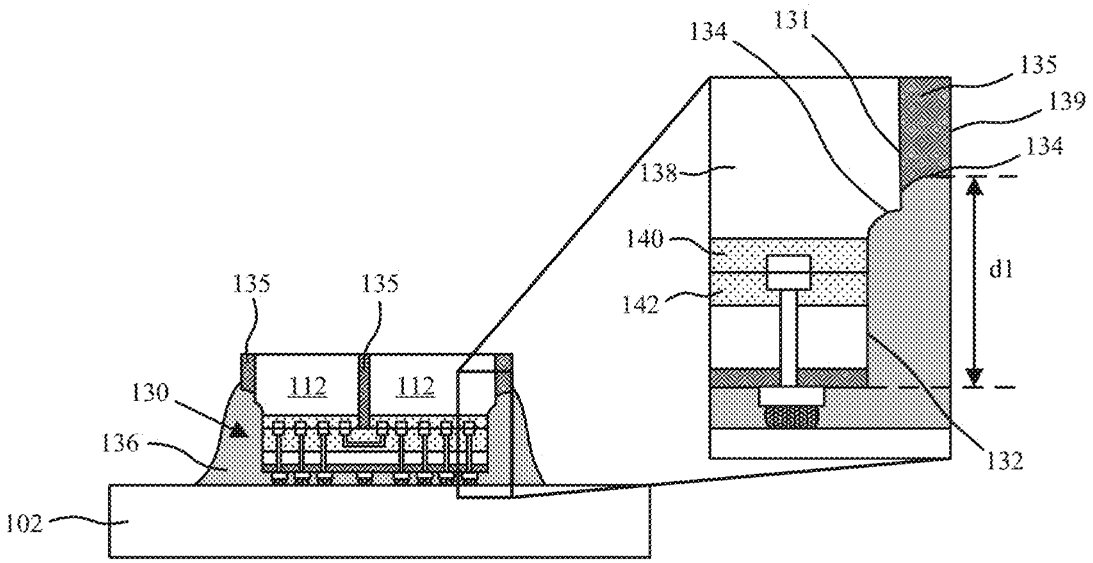
FIG. 8A is a schematic top view illustration of a molded IC structure with side recesses and singulation through a gap fill material in accordance with an embodiment.
Figure 8B:
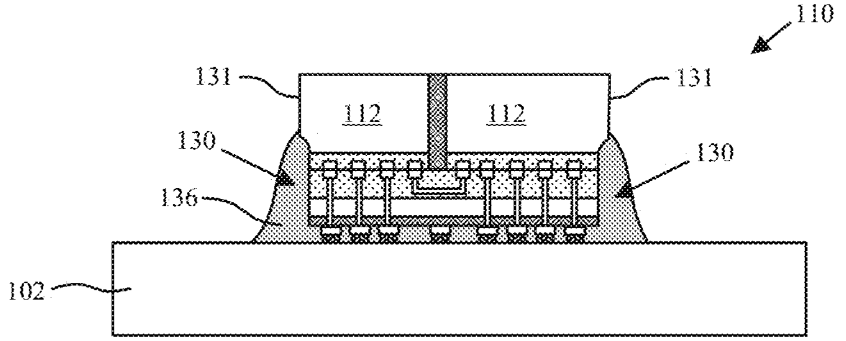
FIG. 8B is a schematic top view illustration of a molded IC structure with side recesses and singulation through the die in accordance with an embodiment.
Figure 8C:
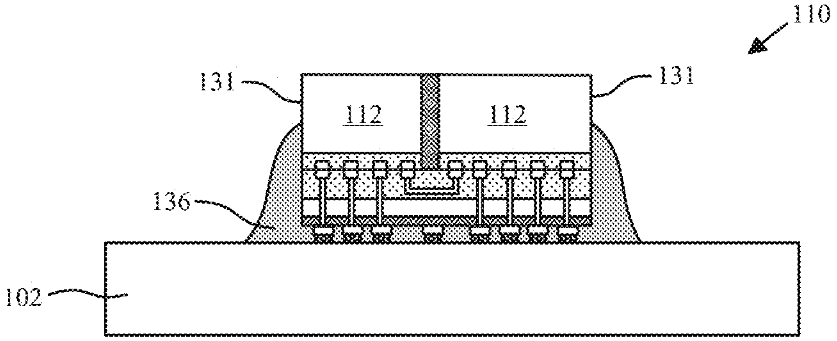
FIG. 8C is a schematic top view illustration of a molded IC structure with singulation through the die in accordance with an embodiment.

Formation of the side recesses 130 in the operation described with regard to FIG. 7C can be utilized to remove high-risk areas for de-bonding across the direct bonded interface between the dies 112 and electronic component 114. The subsequent mechanical sawing operation described with regard to FIG. 7D is used to singulate the IC structure 110 and can be applied in different locations. FIG. 8A is a schematic top view illustration of a molded IC structure 110 with side recesses and singulation through the gap fill material 135 in accordance with an embodiment. In such an embodiment, the recess roof 134 spans both the semiconductor layer of the die 112 and the gap fill material 135 and the side recess 130 also extends into the gap fill material 135. The outside edge of the IC structure 110 therefore corresponds to the outer edge 139 of the gap fill material 135 as opposed to the outermost lateral sidewall 131 of the die 112. The recess roof 134 may have a smooth transition between the semiconductor layer 138 of the die and the gap fill material 135, or a notch as show, where material removal rate of the semiconductor layer 138 is faster, resulting in greater depth d1 through the gap fill material 135 within the same side recess 130. FIG. 8B is a schematic top view illustration of a molded IC structure 110 with side recesses and singulation through the die 112 in accordance with an embodiment. Similar to previously described embodiments, the outermost lateral sidewall 131 of the die 112 also corresponds to the outside edge of the IC structure 110. FIG. 8C is a schematic top view illustration of a molded IC structure with singulation through the die in accordance with an embodiment. Such an embodiment may be accomplished purely with mechanical sawing if desired, or in combination with laser drilling, plasma etching, stealth etching, etc.

Referring briefly back to FIG. 3 and FIG. 5, in the illustrated embodiments the singulation path 166 extends through both a die 112 and through the gap fill material 135 laterally surrounding an adjacent die 112. In accordance with embodiments a dummy chiplet may also be fusion bonded or hybrid bonded to the electronic component 114 to aid in the mechanical sawing operation, and evenly distribute stress during sawing.

Figure 11A:
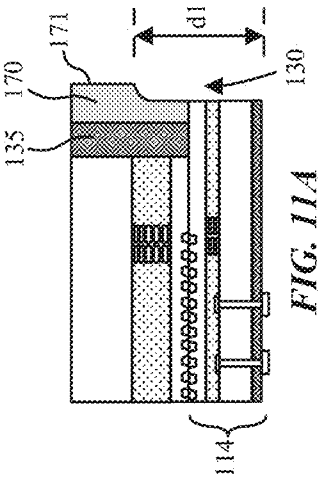
FIG. 11A is a schematic cross-sectional side view illustration taken along line A-A of FIG. 10 in which a side recess is formed in the dummy chiplet in accordance with an embodiment.
Figure 11B:
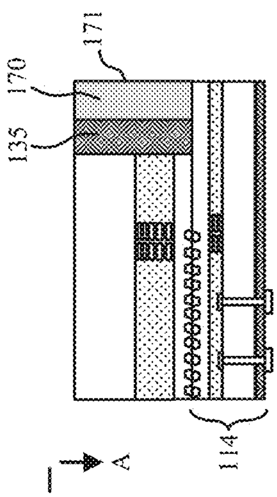
FIG. 11B is a schematic cross-sectional side view illustration taken along line A-A of FIG. 10 in which a side recess is not formed in the dummy chiplet in accordance with an embodiment.
Figure 12:
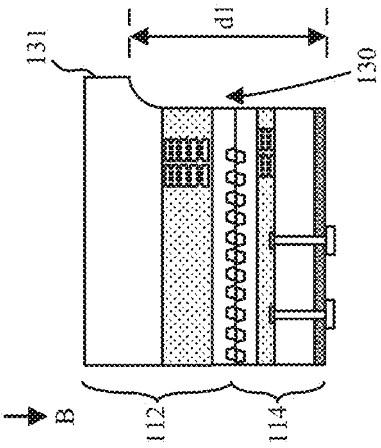
FIG. 12 is a schematic cross-sectional side view illustration taken along line B-B of FIG. 10 in accordance with an embodiment.
Figure 10:
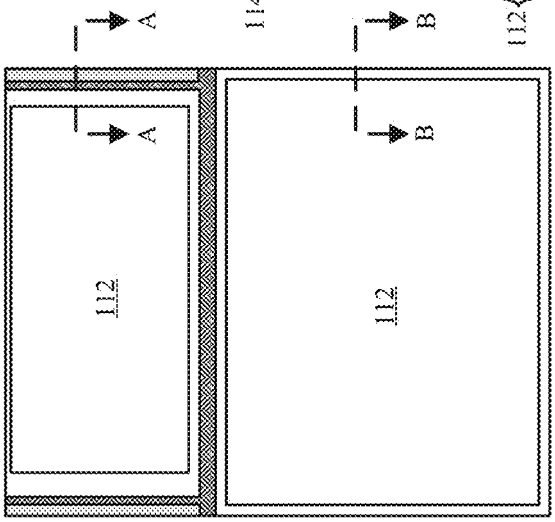
FIG. 10 is a schematic top view illustration of a molded IC structure including dummy chiplets after singulation in accordance with an embodiment.
Figure 9:
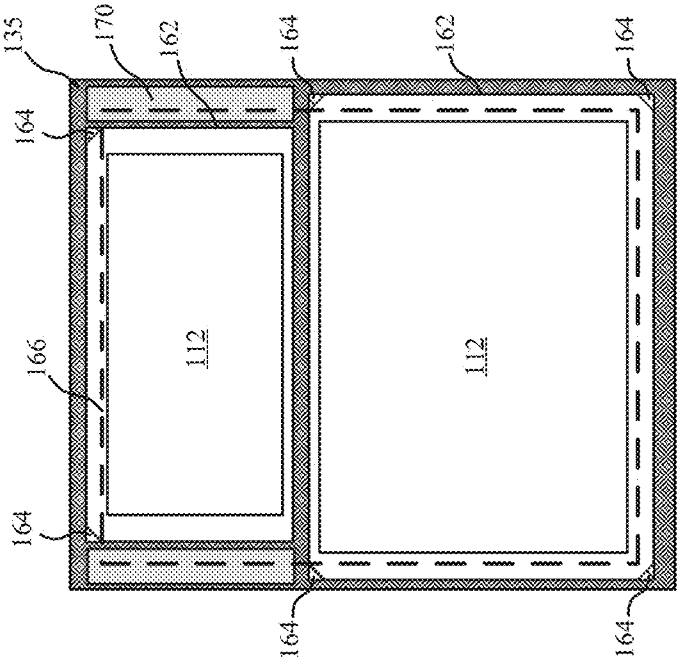
FIG. 9 is a schematic top view illustration of a molded IC structure including dummy chiplets prior to singulation in accordance with an embodiment.

FIG. 9 is a schematic top view illustration of a molded IC structure 110 including dummy chiplets 170 prior to singulation in accordance with an embodiment. For example, dummy chiplets can be silicon bulk layers, and fusion bonded with dielectric-dielectric bonds, or optionally hybrid bonded with the addition of dummy metal bond pads. As can be seen, the singulation path 166 extends through the dummy chiplet 170. FIG. 10 is a schematic top view illustration of the molded IC structure of FIG. 9 including dummy chiplets 170 after singulation in accordance with an embodiment. In such a configuration, sawing is primarily formed across semiconductor materials (e.g., silicon), only cutting through the gap fill material 135 between semiconductor pieces. In such an embodiment, a shared outside edge of the IC structure 110 can be defined by both the exterior edge 171 of the dummy chiplet 170 formed during sawing as shown in FIG. 11A-11B, as well as the outermost lateral sidewall 131 of the die 112 as shown in FIG. 12, also formed during the same sawing operation. In such an embodiment as that illustrated in FIG. 11A the side recess 130 can be formed across the entire outside edge of the IC structure 110, and within the dummy chiplet 170. In the embodiment illustrated in FIG. 11B the side recess 130 may be selectively formed underneath the die 112, and not underneath the dummy chiplet 170. In comparison of FIG. 11A and FIG. 12, the depth d1 of the side recess 130 may be different within the dummy chiplet 170 and the die 112 due to different materials and material removal rates. For example, the depth d1 may be less in the dummy chiplet than within the die 112. The depth d1 may be greater in the short distance of the gap fill material 135 between the die 112 and the dummy chiplet where the side recess 130 is formed across the entire outside edge of the IC structure 110. Thus, the profile of depth d1 may vary along the outside edge of the IC structure.

In accordance with embodiments the electronic component 114 footprint may be arca determining for the IC structure 110. More specifically, location of the seal ring 162 may be determinate of where side recesses 130 and singulation can occur, since cutting through the seal ring 162 could provide a conduit for ingress of moisture and impurities. As such the floorplan in accordance with embodiments may consider location of the corresponding seal rings. Residual overlay markers associated with placement of the dies 112 may also be indicative of the integration process. Furthermore, in some embodiments it may be determined that the singulation path 166 does not need to proceed through silicon on all sides, and the bonded interface may only be removed on some sides of the IC structure 110.

Figure 13:
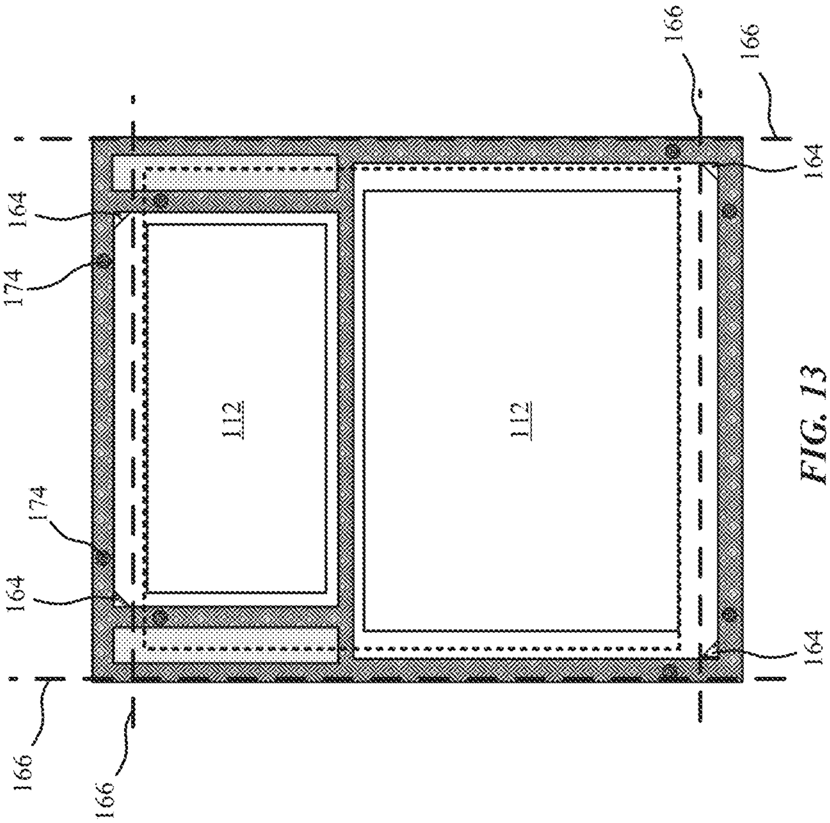
FIG. 13 is a schematic top view illustration of a molded IC structure including dummy chiplets prior to singulation in accordance with an embodiment.

FIG. 13 is a schematic top view illustration of a molded IC structure including dummy chiplets 170 prior to singulation in accordance with an embodiment. Also shown in FIG. 13 is overlay markers 174 outside corners of the dies 112. For example, overlay markers 174 may be formed on electronic component 114 for aligning the dies 112 during direct bonding. In the particular embodiment illustrated a variety of structural features are illustrated together, though need not necessarily be combined. Initially, the singulation paths 166 illustrated in FIG. 13 proceed through dies 112 only along two side edges of the IC structure 110. Singulation may proceed through the bottom electronic component 114 and overlying gap fill material 135 along other edge(s). Where the footprint of dies 112 is usually less than the area within the seal ring 162 of the electronic component, the corner overlay markers 174 for the dies 112 may commonly be located within the seal ring 162 outline. However, where die 112 edges are cut during singulation in accordance with embodiments, an associated overlay marker 174 with that singulated edge may also be singulated and removed from the final IC structure 110. This is shown by the overlay markers 174 outside of the singulation paths 166 in FIG. 13. As such a resulting structure may be an overlay marker 174 near one edge of a die 112 that does not include a side recess 130, where an overlay marker 174 is not located adjacent to the edge of the side recess 130 for the die 112 since portion of the bonded interface has been removed.

Figure 14:
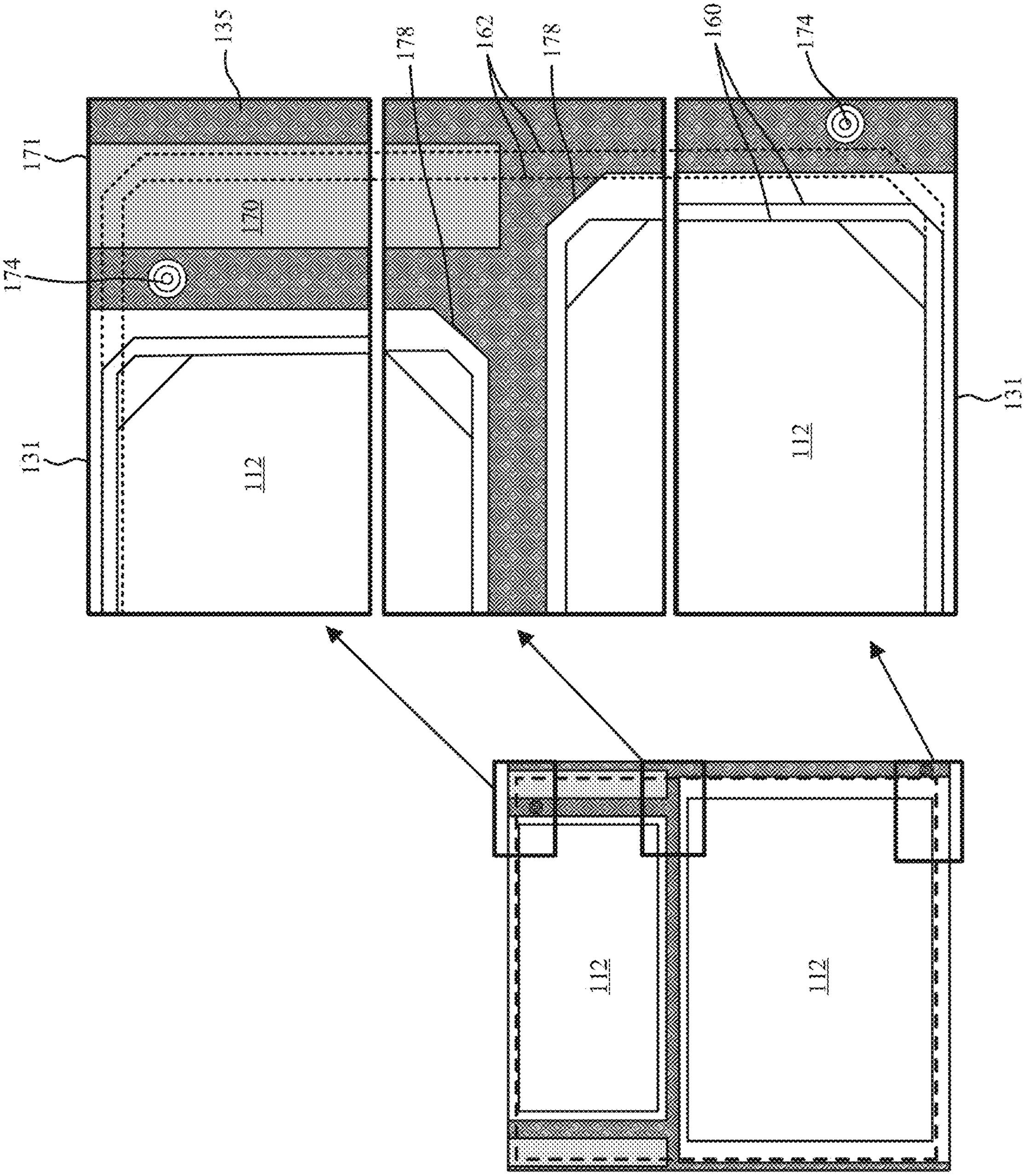
FIG. 14 is a schematic top view illustration of a molded IC structure including dummy chiplets after singulation in accordance with an embodiment.

FIG. 14 is a schematic top view illustration of a molded IC structure, such as that of FIG. 13, including dummy chiplets after singulation in accordance with an embodiment. Furthermore, the close-up view gives additional details of the corresponding seal rings 160, 162, overlay marker 174 location, and as well as chamfered corners 178 of the dies 112, and corresponding chamfers of the seal rings 160 of the dies 112. As an initial matter, the overlay markers 174 can be located outside the seal ring 162 of the electronic component 114 and may be removed completely along singulated edges of the IC structure including outermost lateral sidewall 131 of the die 112. Furthermore, the die 112 may not include a chamfered corner 178 along such a singulation edge, or at least an incomplete chamfered corner 178.

Figure 15:
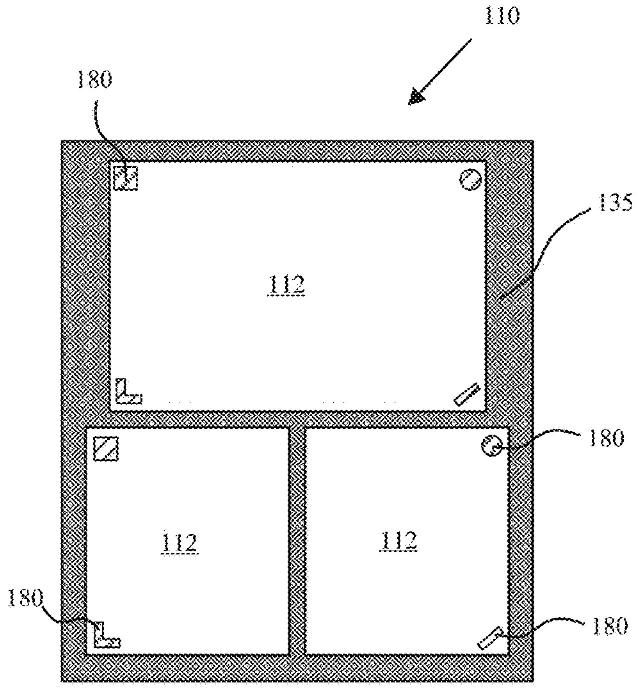
FIG. 15 is a schematic top view illustration of a molded IC structure including one or more local cavities in accordance with an embodiment.

Up until this point various configurations have been described in which high-risk areas for non-bonding of direct bonded interfaces are removed by edge dicing techniques, and in particular with a combination of a grooving operation followed by singulation operation. Embodiments are not limited to application of such techniques across the entire edges or corners, and instead the grooving operations can be applied at selective locations to alleviate locate stresses. FIG. 15 is a schematic top view illustration of a molded IC structure including one or more local cavities 180 in accordance with an embodiment. The local cavities 180 may be formed similarly as the side recesses 130, though in this case may be internally confined. The local cavities may be a variety of shapes depending upon stress to be alleviated. Exemplary structures include round, L-shaped, rectangular, chamfered, etc., and combinations thereof.

Figure 16:
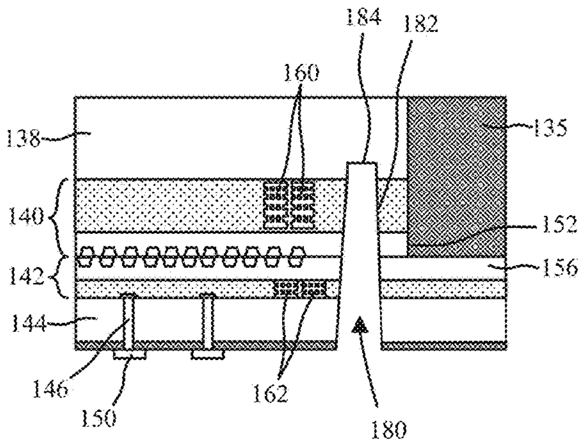
FIG. 16 is a schematic cross-sectional side view illustration of an IC structure including a local cavity formed by plasma etching in accordance with an embodiment.
Figure 17:
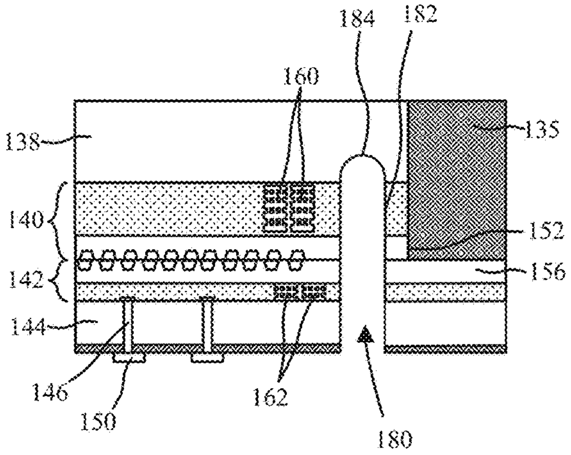
FIG. 17 is a schematic cross-sectional side view illustration of an IC structure including a local cavity formed by laser etching in accordance with an embodiment.

FIG. 16 is a schematic cross-sectional side view illustration of an IC structure including a local cavity 180 formed by plasma etching in accordance with an embodiment. FIG. 17 is a schematic cross-sectional side view illustration of an IC structure including a local cavity 180 formed by laser etching in accordance with an embodiment. It is to be appreciated that the particular structural arrangement may depend upon etching recipes. In the particular embodiment illustrated in FIG. 16, the plasma etching technique may result in a flat cavity roof 184, and straight or tapered sidewalls 182. In the particular embodiment illustrated in FIG. 17, the laser etching technique may result in a tapered cavity roof 184, and straight or tapered sidewalls 182. The flat and curved sidewalls and roofs illustrated in FIGS. 16-17 associated with the particular etching techniques can also be present with any of the side recesses 130 described herein since similar etching techniques may be used. After mounting the IC structure 110 onto a module substrate 102 such as that illustrated in FIG. 1B, the underfill material 136 may encroach and partially or fully fill the local cavities 180. Alternatively, the local cavities 180 can be substantially filled with one or more layers of cavity fill material (e.g., molding compound(s)) and may include a protective liner layer (similar to embodiments described with regard to FIGS. 20A-20E). For example, substantially filled may include completely filled, less any volume occupied by optional protective liner layer(s) for example.

Figure 18:
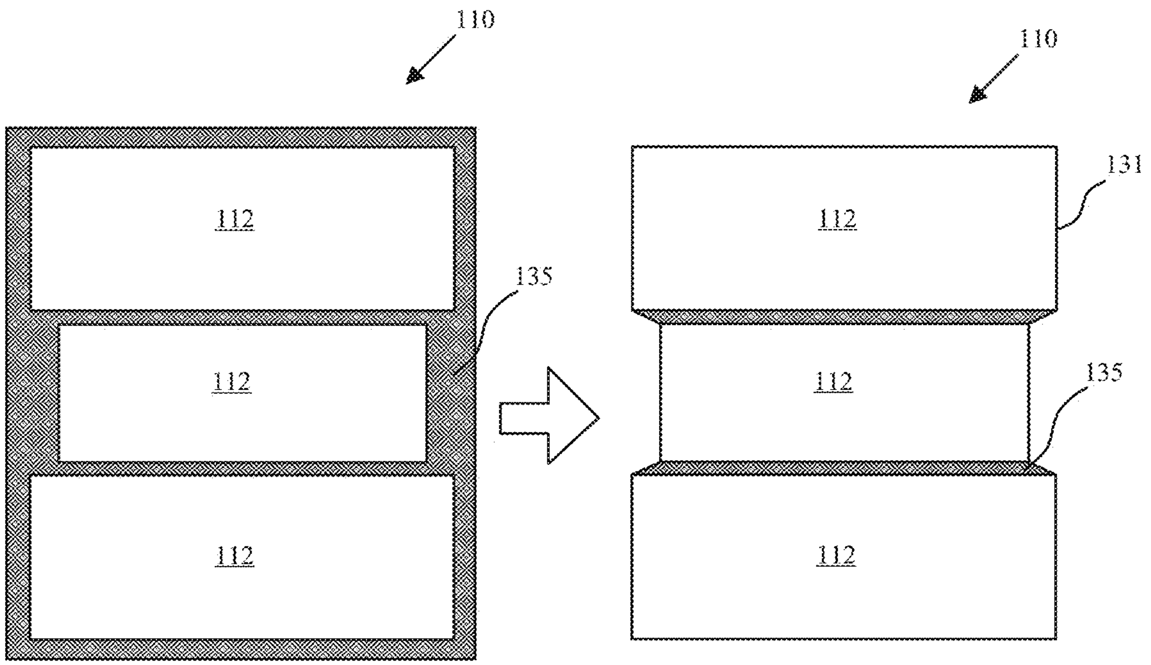
FIGS. 18-19 are schematic top view illustrations of dicing sequences including selective singulation of non-direct bonded surfaces in accordance with embodiments.
Figure 19:
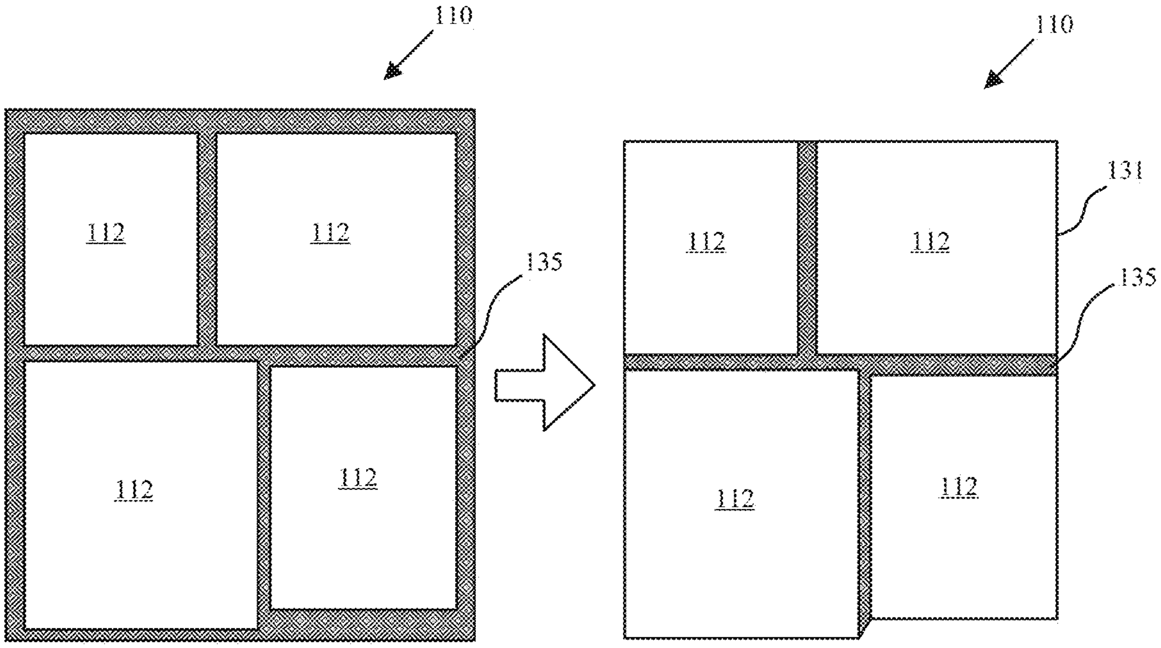

Up until this point embodiments have been described in which the final singulation operation performed is with a mechanical blade, or otherwise at a global dimension. Selective etching and singulation may also be performed. FIGS. 18-19 are schematic top view illustrations of dicing sequences including selective singulation of non-direct bonded surfaces in accordance with embodiments. As shown, when dicing solutions such as laser etching and plasma etching are employed, the resultant diced edges of the IC structure 110 are not limited to straight lines. In accordance with embodiments etching techniques such as plasma dicing and/or stealth dicing are utilized to substantially remove the non-direct-bonded interfaces in the IC structure 110. Two exemplary die (or chipset) arrangements are illustrated before and after singulation. As shown, a selective approach that is enabled by laser or plasma etching can carve out multiple die 112 systems where the amount of gap fill material 135 is limited.

FIGS. 20A-20E are schematic cross-sectional side view illustrations of IC structures with various side recesses and dual side molding in accordance with embodiments. In particular, the IC structures of FIGS. 20A-20E are similar to those previously described herein with some processing additions, such as encapsulation of the electronic component 114, that can optionally be incorporated in accordance with embodiments.

Similar to previous embodiments the IC structures can include an electronic component 114 with a first bonding surface 116, and one or more dies 112, each die 112 including a second bonding surface 118 bonded directly to the first bonding surface 116. Side recesses 130 can be formed to extend through an entire thickness of the electronic component 114, and optionally into the die(s) 112. The side recesses 130 can define a recess sidewall 132 extending through the entire thickness of the electronic component 114 and a recess roof 134 within the die 112. The recess roofs 134 additionally can intersect with the outermost lateral sidewalls 131 of the dies 112 such that the outermost lateral sidewalls 131 are exterior to the recess sidewalls 132. In some embodiments the recess roofs 134 can extend into the gap fill material 135 (e.g., molding compound). The side recesses 130 can extend a variety of depths in accordance with embodiments. As shown, the side recesses 130 can extend past the second bonding surfaces 118 and into the dies 112. For example, the side recesses can extend into or past the build-up structures 140, and into the semiconductor layer 138.

In accordance with the embodiments illustrated in FIGS. 20A-20E the IC structures 110 can be dual side molded (or otherwise filled), including the gap fill material 135 (e.g., a first molding compound layer), and one or more additional recess fill material layers 186 (e.g., molding compound layers) within the side recesses 130. The gap fill material 135 and the one or more additional recess fill material layers 186 can be the same or different materials to address warpage, stress, cost, etc.

Figure 20A:
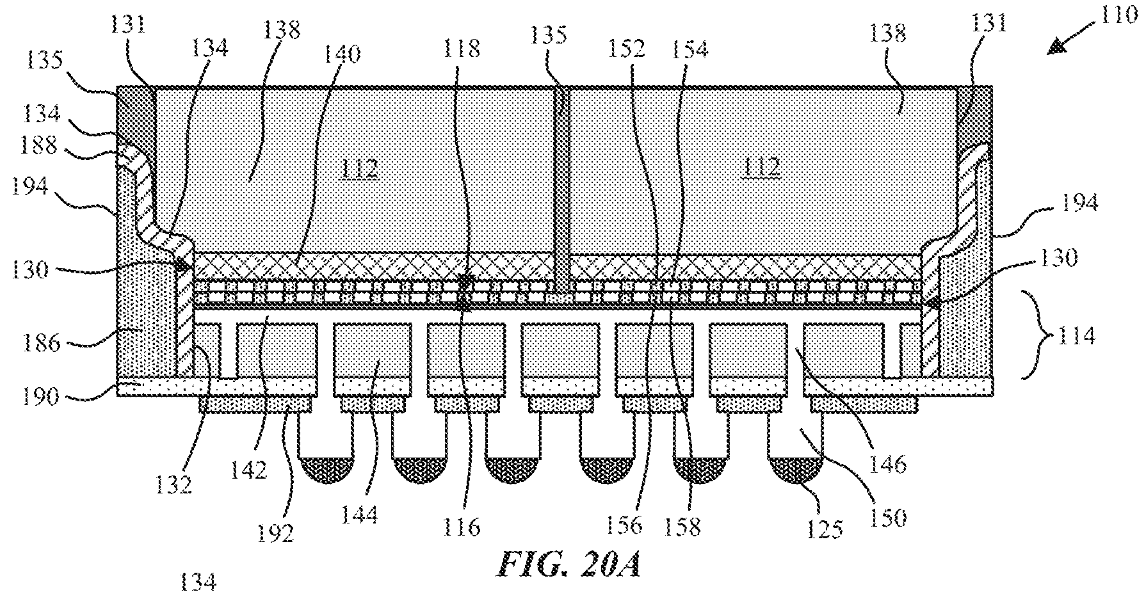
FIGS. 20A-20F are schematic cross-sectional side view illustrations of IC structures with various side recesses and dual side molding in accordance with embodiments.

Referring now to FIG. 20A the electronic component 114 can be similar to those previously described. For example, the electronic component 114 may be a die, interposer, etc. As shown, the electronic component can include a first bonding surface 116, a plurality of metal bond pads 158, and dielectric bonding layer 156. Similarly, the one or more dies 112 can each include a second bonding surface 118, a plurality of metal bond pads 154 and dielectric bonding layer 152. The electronic component 114 may also include a semiconductor layer 144 (which can also be a bulk layer not formed of silicon) and BEOL build-up structure 142. Alternatively, semiconductor layer 144 can be substituted with another bulk material such as glass. The BEOL build-up structure 142 may include electrical routing, and optionally die-to-die routing between the dies 112. A plurality of through vias 146 (e.g., through silicon vias) can extend through the semiconductor layer 144 and backside dielectric layer 148 to make contact with terminals 150, onto which solder bumps (which can also be solder tips) 125 can be placed.

In the particular embodiment illustrated in FIG. 20A the side recesses 130 can be filled with one or more optional liner layers 188, which conform to the contour, and form an outline of (e.g., with substantially uniform thickness along) the recess sidewall 132 and recess roof 134. The liner layer 188 may conform to a contour and form an outline along the recess sidewall and recess roof of the side recess, with the liner layer being between the one or more recess fill material layers and the side recess. The remainder of the side recesses 130 can be filled with one or more recess fill material layers 186 (e.g., molding compound material).

Still referring to FIG. 20A, in the illustrated embodiment, a passivation layer 190 can be deposited over (e.g., a planarized surface of) the one or more recess fill material layers 186, liner layer 188, and semiconductor layer 144 (or other bulk layer, etc.). As such, the passivation layer 190 may span underneath the one or more recess fill material layers 186 and the electronic component 114. A plurality of terminals 150 can additionally be formed underneath the passivation layer. Both the liner layer 188 and passivation layer 190 can be formed of suitable materials (e.g., silicon nitride) to function as barrier layers, such as to block the ingress of moisture or diffusion of other materials. A solder mask layer 192 can optionally be formed underneath the passivation layer 190 to facilitate the formation of terminals 150. In the particular embodiment illustrated in FIG. 20A, the IC structure 110 includes sidewalls 194 spanning the gap fill material 135, liner layer 188, one or more recess fill material layers 186, and passivation layer 190. In the particular embodiment illustrated in FIG. 20A, the side recess 130 includes multiple recess levels with different depths and widths. This may be attributed to multiple etching operations, for example, a first etching operation partially or completely through the electronic component 114, and a second etching operation through the hybrid bonding interface formed by the metal bond pads 154, 158 and dielectric bonding layers 152, 156.

Figure 20B:
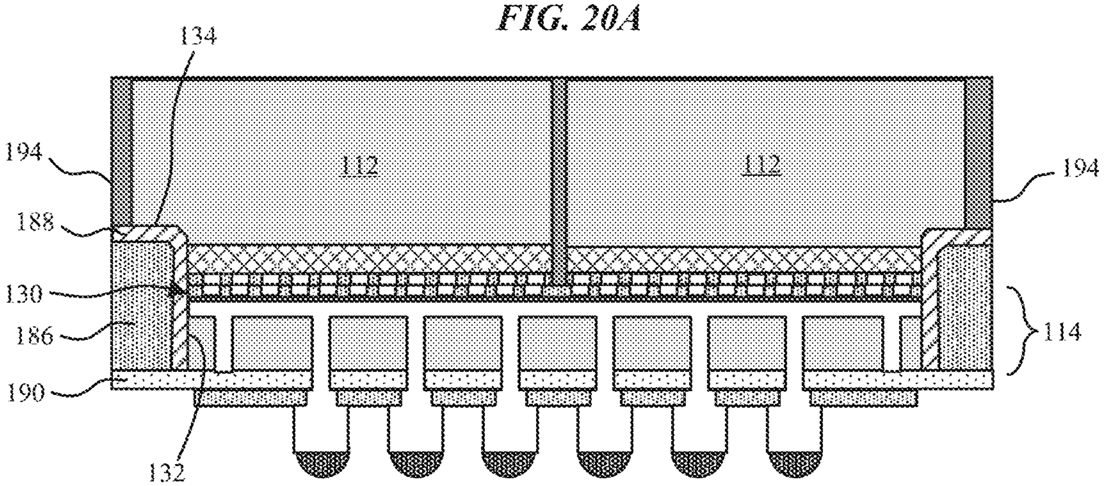
Figure 20C:
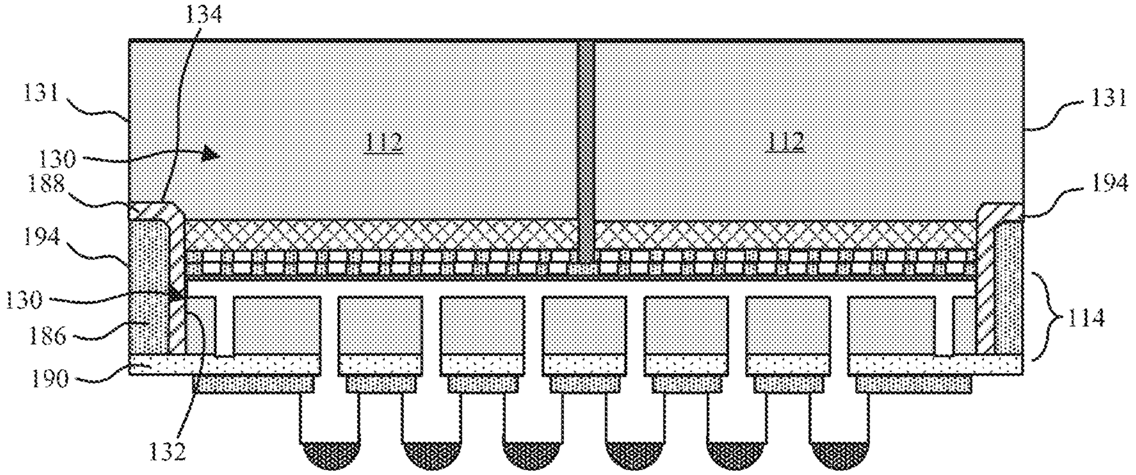
Figure 20D:
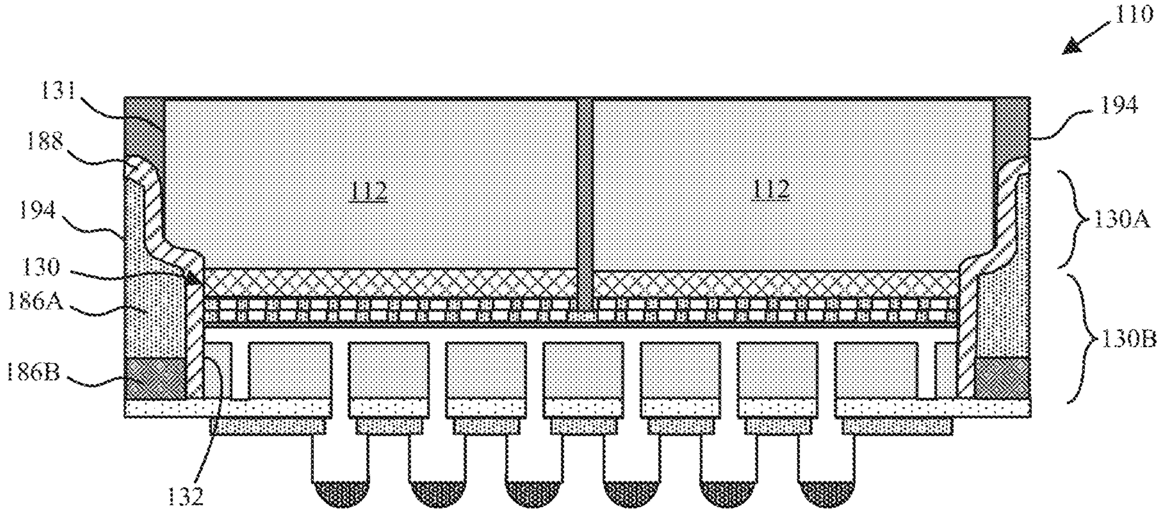
Figure 20E:
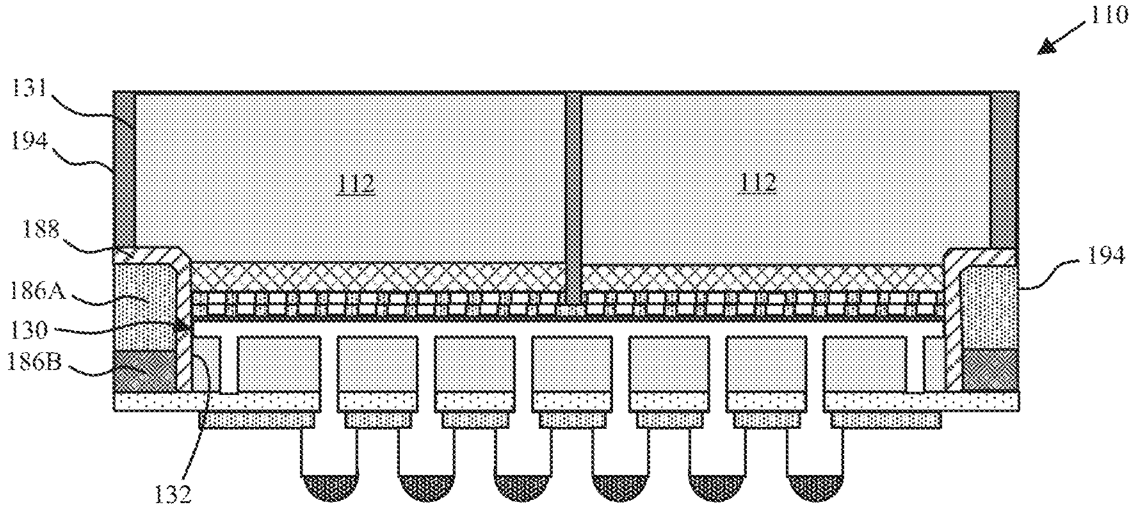

Referring now to FIG. 20B, an IC structure 110 is illustrated similar to that of FIG. 20A, with one difference being that the side recess 130 may have been formed with a single etching operation, with a single level roof 134. The embodiment illustrated in FIG. 20C is similar to that of FIG. 20B, with one difference being that package singulation can include cutting through the die 112 edges. In the illustrated embodiment, the IC structure 110 sidewalls 194 span the die 112 outermost lateral sidewall 131, liner layer 188, one or more recess fill material layers 186, and passivation layer 190. The embodiment illustrated in FIG. 20D is similar to that of FIG. 20A with multiple recess fill material layers 186A, 186B filling the side recesses 130. As shown, a first recess fill material layer 186A can partially or completely fill in upper region 130B of the side recess 130 (e.g., formed from a second etching operation), and a second recess fill material layer 186B can partially or completely fill a lower region 130A of the side recess (e.g., formed from a first etching operation). The embodiment illustrated in FIG. 20E is similar to that of FIG. 20B, with first recess fill material layer 186A and second recess fill material layer 186B filling the side recesses 130. The first and second gap fill material layers in accordance with embodiments can be formed of the same or different materials.

Figure 20F:
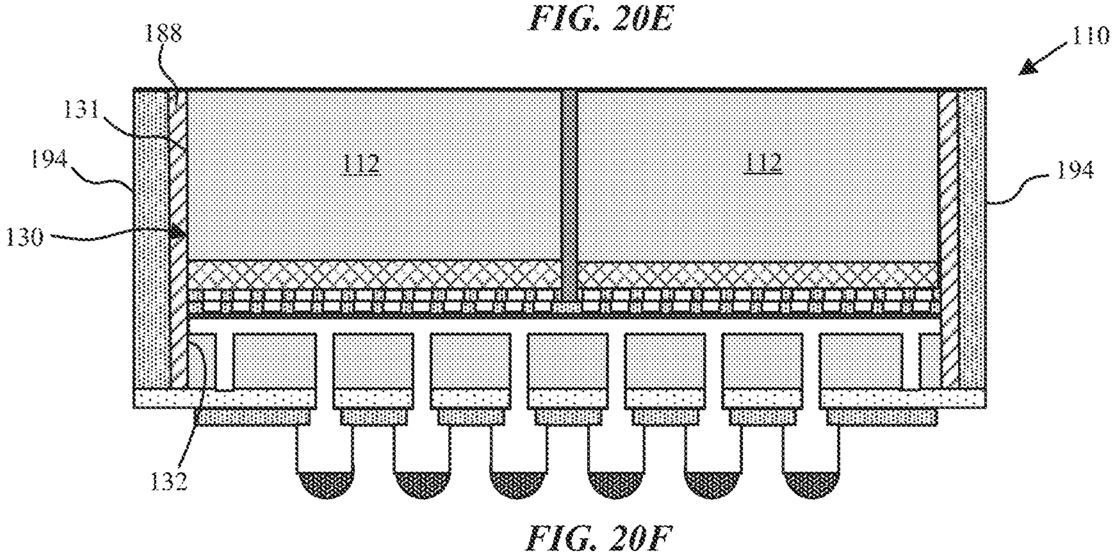

Referring now to FIG. 20F, yet another variation illustrated. In this illustrated embodiment, the side recesses 130 can extend completely through a thickness(es) of the dies 112. In such an embodiment, the optional liner layers 188 can span across the entire outermost lateral sidewall 131 of the dies 112 (which will also correspond to the recess sidewalls 132). The one or more recess fill material layers 186 can then be deposited to fill the side recesses 130. Singulation of the IC structure 110 can then be through the passivation layer 190 and one or more recess fill material layers 186.

Figure 21A:
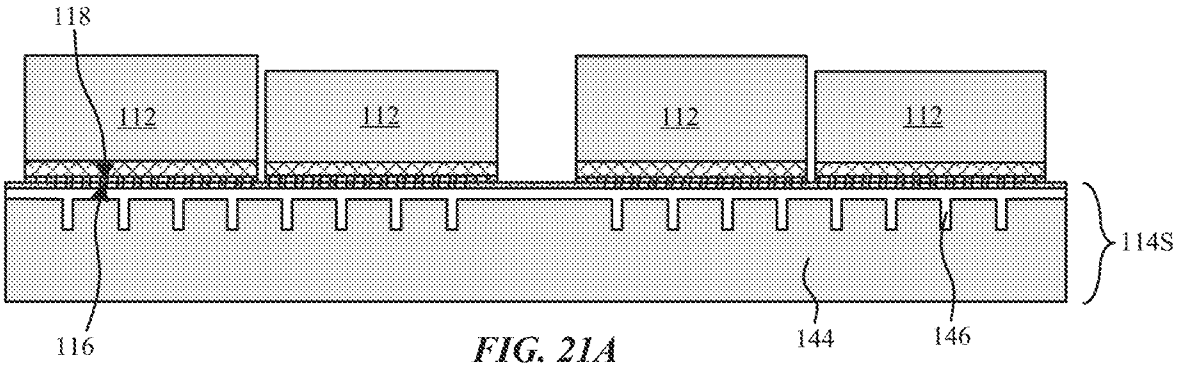
FIGS. 21A-21M are schematic cross-sectional side view illustrations for a method of forming an IC structure with side recesses and dual side molding in accordance with an embodiment.
Figure 21B:
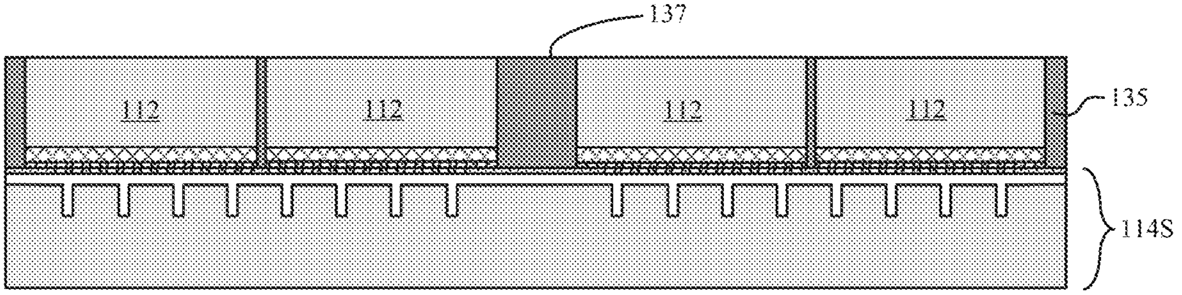
Figure 21C:
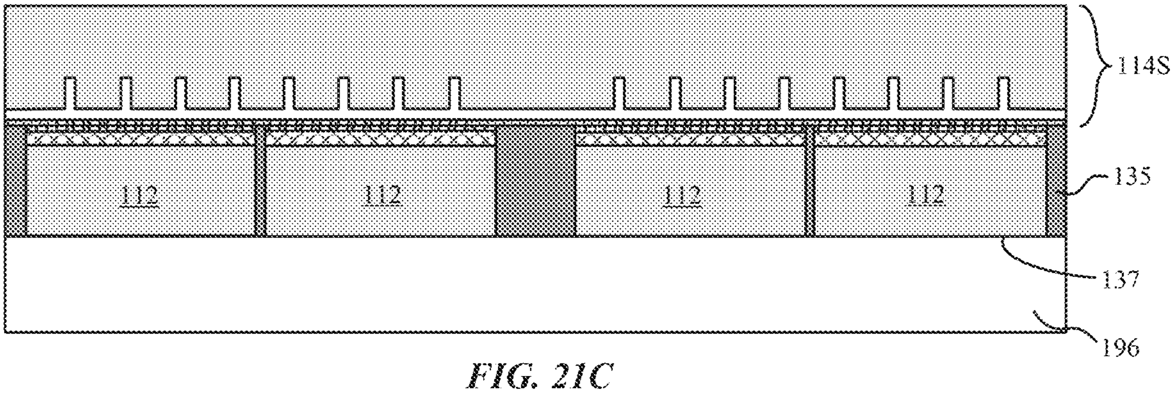
Figure 21D:
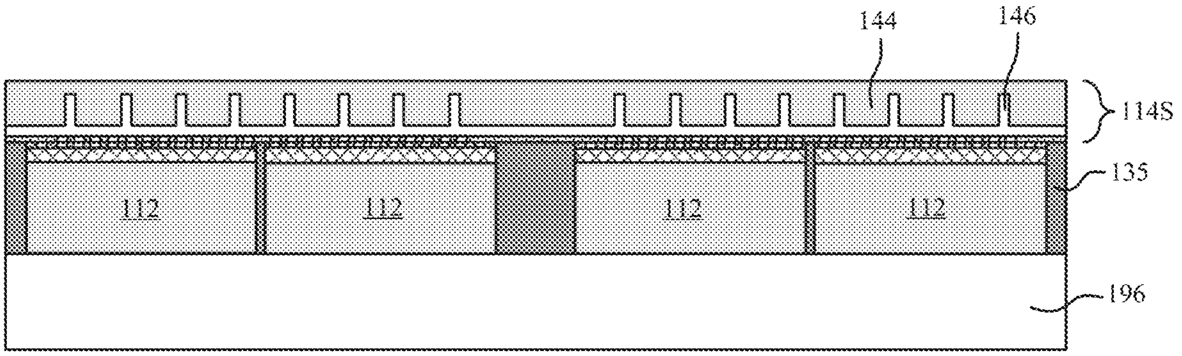

FIGS. 21A-21M are schematic cross-sectional side view illustrations for a method of forming an IC structure with side recesses and dual side molding in accordance with an embodiment. Specifically, the process sequence illustrated in FIGS. 21A-21M is provided with regard to the IC structure of FIG. 20A, though it is to be appreciated that various process variations can be incorporated to fabricate other IC structures, such as those illustrated in FIGS. 20B-20F. As shown in FIG. 21A the sequence may begin with directly bonding (e.g., fusion bonding, hybrid bonding) dies 112 to an electronic component substrate 114S, which may be at the wafer scale. The dies 112 can then be encapsulated on the electronic component substrate 114S with a gap fill material 135, such as molding compound as shown in FIG. 21B. This may then optionally be followed by a thinning operation where the gap fill material 135, and optionally back sides of the dies 112, are ground back to form a planarized surface 137. The molded structure can then be flipped with the planarized surface 137 attached to a carrier substrate 196, for example with an adhesive layer, as shown in FIG. 21C. This may then be followed by an optional grinding operation to reduce a thickness of the electronic component substrate 114S. In the particular configuration illustrated in FIG. 21D the semiconductor layer 144 (or other bulk layer) can be thinned. Where through silicon vias 146 are pre-formed, they may optionally not be exposed at this operation.

Figure 21E:
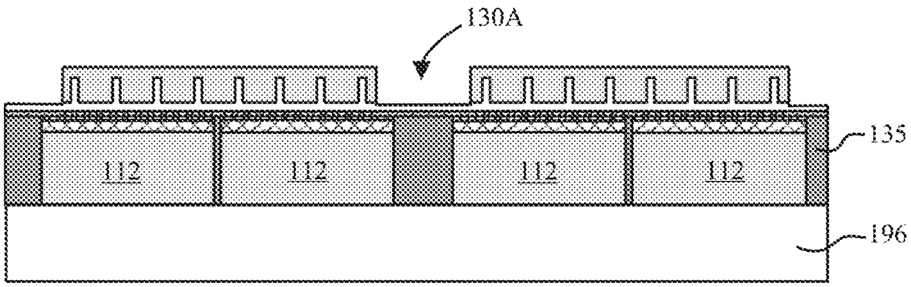
Figure 21F:
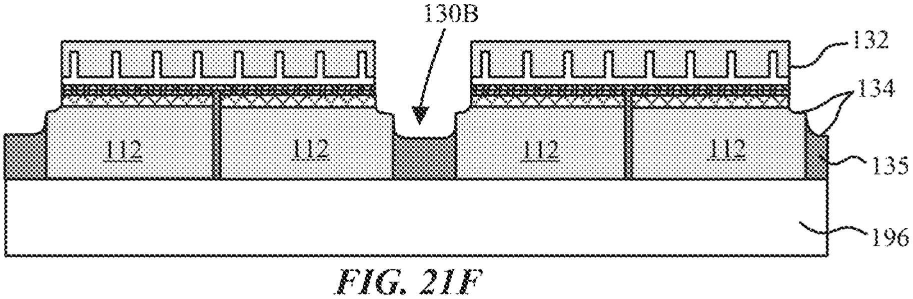

Referring now to FIG. 21E a first etching operation can be performed to form a pattern of lower regions 130A of sidewall recesses 130 through the semiconductor layer 144 of the electronic component substrate 114S. For example, this may optionally remove keep out zone (KOZ) silicon area. This can be followed by a second etching operation as shown in FIG. 21F to further remove the KOZ hybrid bond layer completely and form the upper regions 130B of the sidewall recesses 130. Suitable etching techniques, such as plasma etching, may be selected based on materials. It is to be appreciated that this multiple operation etching sequence is optional and a single etching operation can be performed to form the sidewall recesses 130.

Figure 21G:
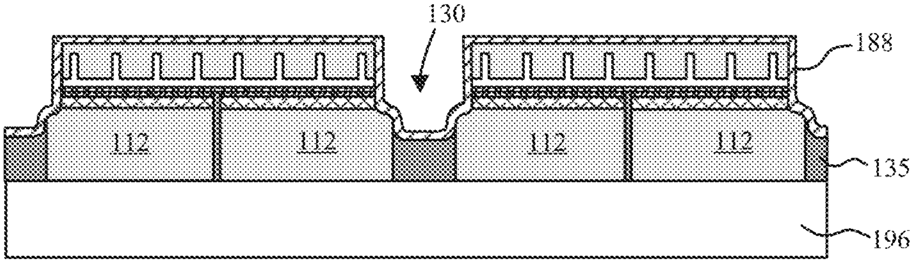

As shown in FIG. 21G, a liner layer 188 can optionally be formed which confirms to the contour, and forms an outline of (e.g., with substantially uniform thickness along) the recess sidewall(s) 132 and recess roof(s) 134. The liner layer 188 may be a single layer (e.g., $SiN_x$) or multiple layers. In an embodiment, the liner layer includes a sequential layer stack of $SiN_x$, $SiO_2$, $SiN_x$. The liner layer 188 may be substantially conformal to the contour, and form an outline of (e.g., with substantially uniform thickness along) the recess sidewall 132 and recess roof 134 of the sidewall recesses.

Figure 21H:
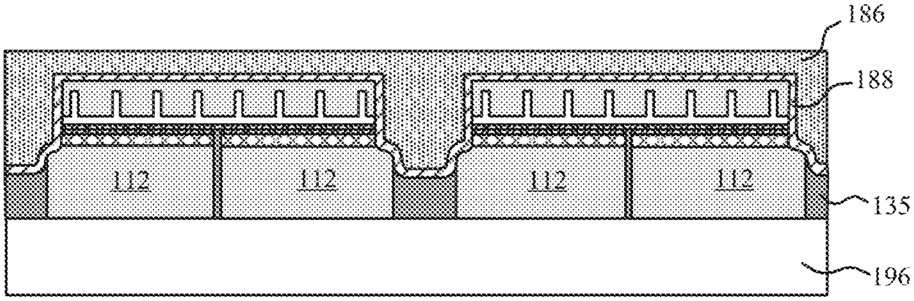

Following deposition of the optional liner layer 188 one or more recess fill material layers 186 (e.g., molding compound material) can be applied as shown in FIG. 21H. For example, this may be accomplished with a molding operation in which a molding compound material is applied within the sidewall recesses 130 and optionally over the optional liner layer 188 spanning over the patterned electronic component substrate and within the sidewall recesses

Figure 21I:
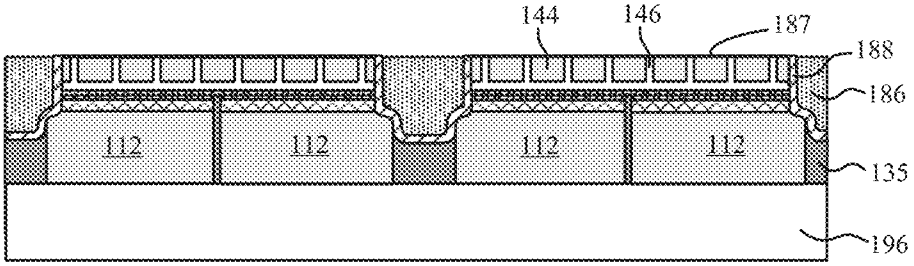
Figure 21J:
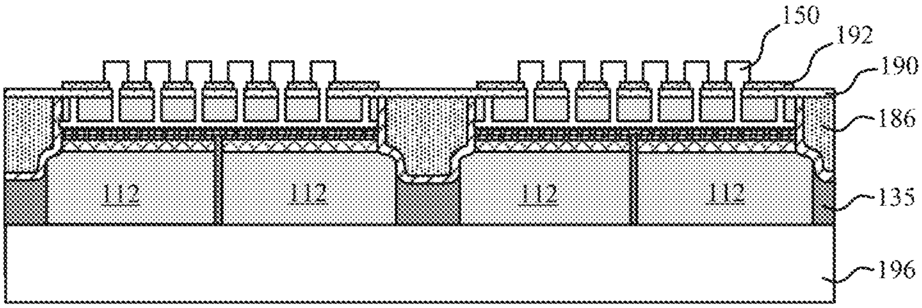
Figure 21K:
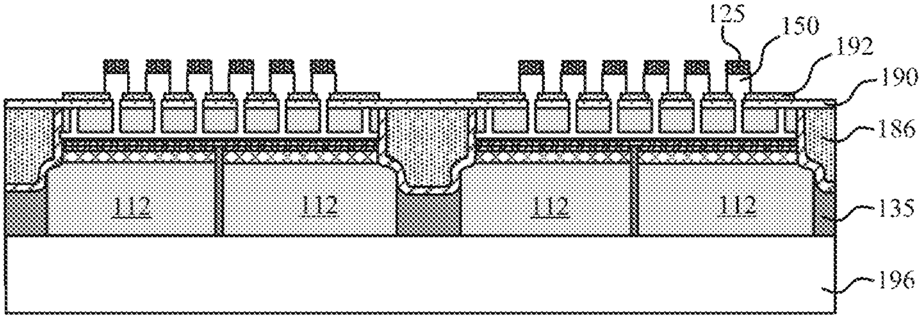

130. This may be followed by a grinding operation as shown in FIG. 21I resulting in a planarized surface 187 spanning the recess fill material layer(s) 186, liner layer 188 and electronic component substrate 114S. For example, the grinding operation may thin the semiconductor layer 144 until the through vias 146 are exposed along the planarized surface 187.

A passivation layer 190 can then be deposited over the planarized surface 187. The passivation layer 190 can be formed of suitable materials (e.g., silicon nitride) to function as barrier layers, such as to block the ingress of moisture or diffusion of other materials. A solder mask layer 192 can optionally be formed on the passivation layer 190 followed by patterning of the solder mask layer and passivation layer to facilitate the formation of terminals 150 and solder bumps 125, for example by electroplating.

Figure 21L:
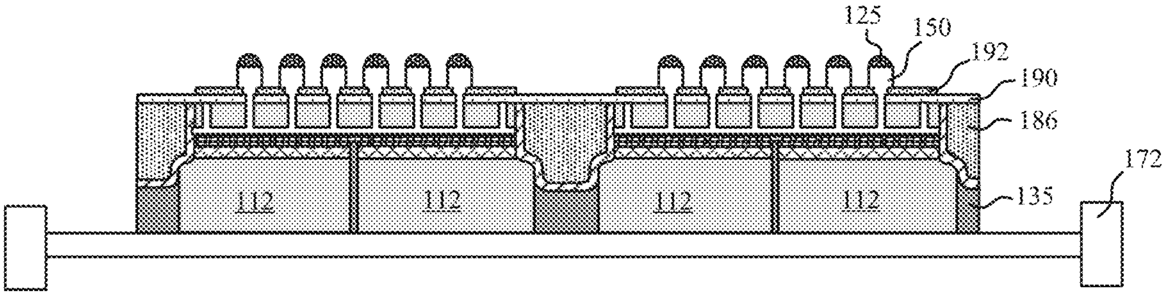
Figure 21M:
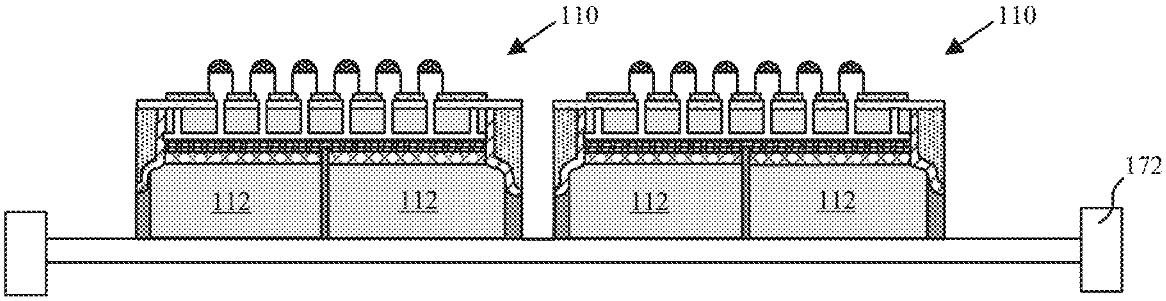

At this point the patterned structure can be removed from the carrier substrate 196 and attached to a frame 172, for example with adhesive tape, as shown in FIG. 21L, followed by solder reflow and singulation into multiple IC structures 110 as shown in FIG. 21M which may then be debonded from the frame 172.

In accordance with embodiments mechanical sawing may be performed for package singulation in which the saw paths 166 can proceed through the die 112 semiconductor layer, gap fill material 135, as well as the recess fill material layer 186 and/or liner layer 188. Alternatively other techniques such as plasma dicing can be used to form the saw paths. Furthermore, it has been observed that high stress regions can be located along corner regions of the dies 112. In accordance with some embodiments, these high stress regions are removed during side recess formation and singulation. Dummy chiplets 170 can also be included to facilitate the sawing process. In some embodiments, a die 112 floor plan within the IC structure 110 can be in an asymmetric arrangement in order to for the saw paths 166 to cut through as many die 112 corners and edges as possible in order to remove the number of potential non-bond and high stress regions in the IC structure 110.

Figure 22A:
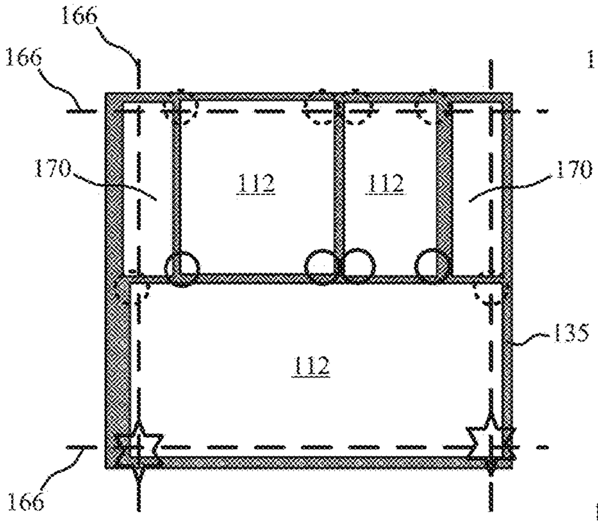
FIG. 22A-22B are schematic top plan view illustrations of singulation paths for three die IC structures and locations of high stress corner regions in accordance with embodiments.
Figure 22B:
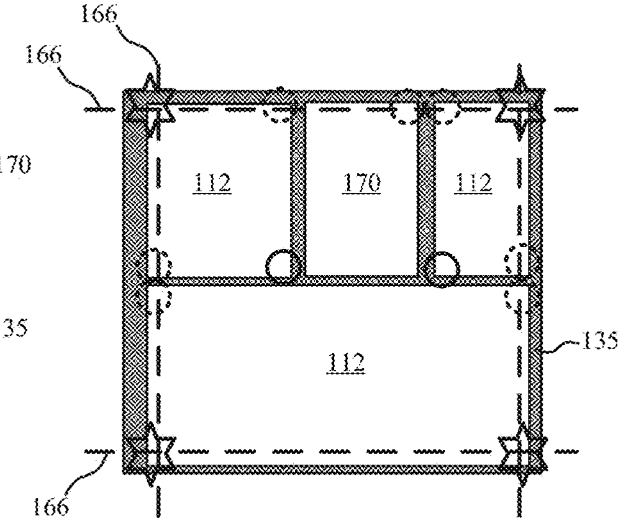

FIG. 22A-22B are schematic top plan view illustrations of singulation paths for three die 112 IC structures and locations of high stress corner regions in accordance with embodiments. As shown, the saw paths 166 do not proceed through die 112 corners annotated with solid circles. A single saw path 166 extends through die 112 corners annotated with dashed circles, and two saw paths 166 extend through die 112 corners annotated with stars. Referring now to the layout in FIG. 22A, in the first arrangement the dummy chiplets 170 may be arranged along the IC structure edges so that the saw paths 166 preferentially proceed through the chiplets 170 in multiple directions. Such an arrangement results in four die 112 corners that are not sawed and can potentially be locations of high stress. The same dies 112 have been rearranged in FIG. 22B so that the saw paths 166 preferentially proceed through dies 112, while only a single saw path 166 extends through a dummy chiplet 170 between the dies. Additionally, the multiple dummy chiplets 170 have been reduced to a single, larger, dummy chiplet 170. As shown, such an arrangement results in two die 112 corners that are not sawed that can potentially be high stress regions. Overall, the rearrangement illustrated in FIGS. 22A-22B shifts from two double-sawed corners (stars) to four double-sawed corners (stars), maintains six single-sawed corners (dashed circles), and shifts four unsawed corners (solid circles) to two unsawed corners (solid circles). Furthermore, the number of sawed die 112 edges shifts from five edges to seven edges.

Figure 23A:
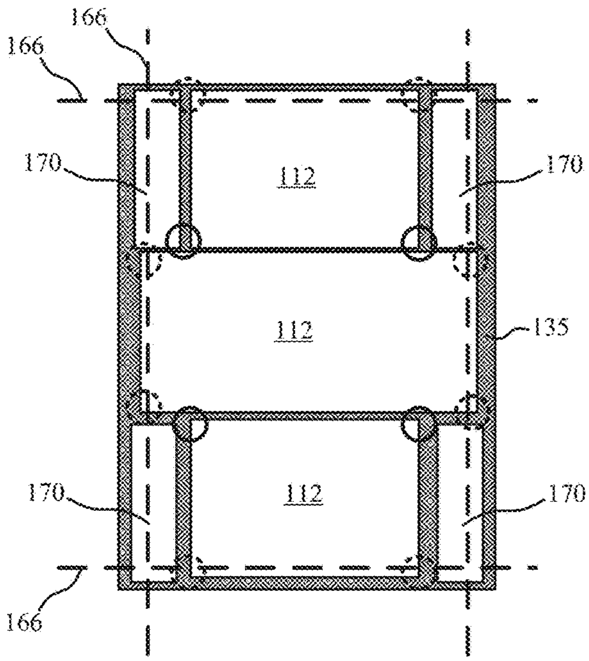
FIGS. 23A-23B are schematic top plan view illustrations of singulation paths for three die IC structures and locations of high stress corner regions in accordance with embodiments.
Figure 23B:
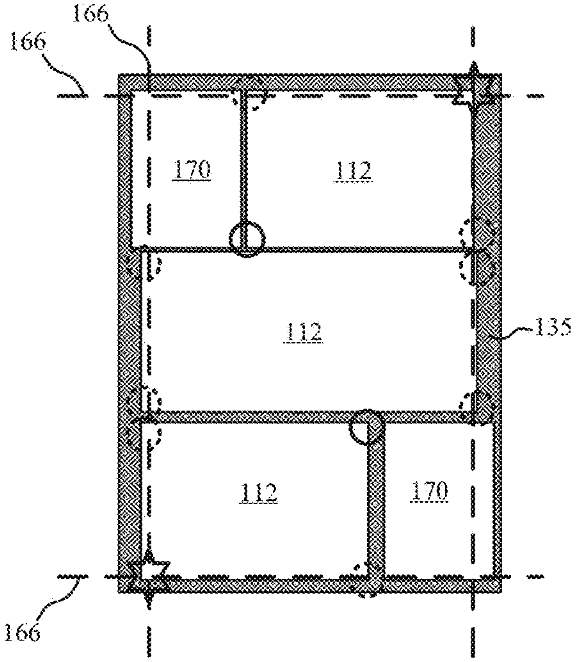

FIGS. 23A-23B are schematic top plan view illustrations of singulation paths for three die IC structures and locations of high stress corner regions in accordance with embodiments. The arrangements of FIGS. 23A-23B illustrate a similar concept for increasing the number of sawed die corners and edges. As shown, in FIG. 23A four dummy chiplets 170 are located along the IC structure 110 corners to be singulated. In the embodiment illustrated in FIG. 23B the four dummy chiplets 170 can be consolidated into two larger dummy chiplets 170 so that saw paths 166 can proceed along more die 112 corners and edges.

Overall, the rearrangement illustrated in FIGS. 23A-23B shifts from zero double-sawed corners (stars) to two double-sawed corners (stars), maintains eight single-sawed corners (dashed circles), and shifts four unsawed corners (solid circles) to two unsawed corners (solid circles). Furthermore, the number of sawed die 112 edges shifts from four edges to six edges.

It is to be appreciated that the arrangements shown in FIGS. 22A-23B are compatible with any of the IC structures 110 described herein, and the principles can also be applied to IC structures with a greater number of dies. Furthermore, it is to be appreciated that saw paths 166 may optionally proceed within sidewall recesses 130 described herein or where no sidewall recesses 130 exist.

Figure 24:
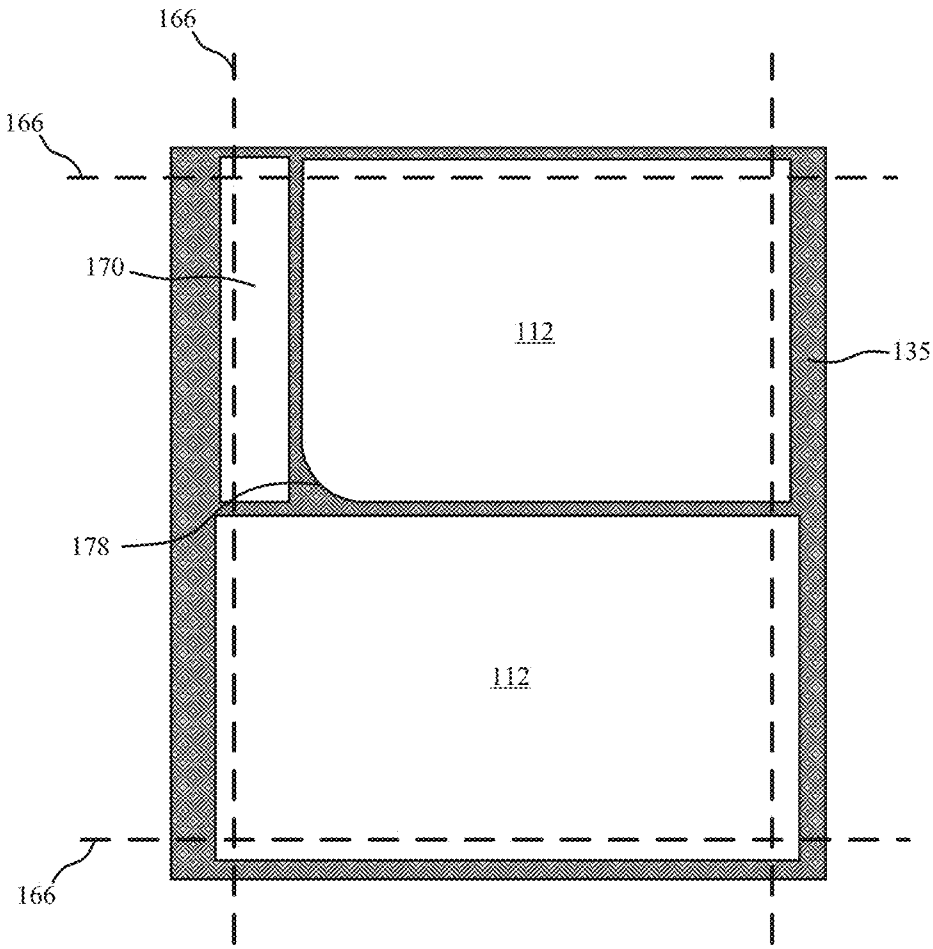
FIG. 24 is a schematic top plan view illustration of a two die IC structure with chamfered die corner in a non-singulated corner in accordance with an embodiment.

While the principles illustrated in FIGS. 22A-23B can be used to reduce the number of non-singulated (unsawed) die 112 corners, it may not be feasible to eliminate non-singulated die corners with the IC structure 110. In accordance with embodiments, these potential high stress regions can be chamfered to reduce stress. FIG. 24 is a schematic top plan view illustration of a two die IC structure 110 with chamfered corner 178 that is not singulated with the IC structure in accordance with an embodiment. The chamfered corners 178 may be straight, as shown in FIG. 14, or optionally rounded as shown in FIG. 24. It is to be appreciated that while a two die 112 arrangement is illustrated, that chamfered corners 178 can be integrated internally within the IC die structure 110 to reduce stress at non-singulated die corners that may otherwise be potential high stress regions.

In utilizing the various aspects of the embodiments, it would become apparent to one skilled in the art that combinations or variations of the above embodiments are possible for forming an integrated circuit structure with side recess. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An integrated circuit structure comprising:

an electronic component including a first bonding surface;

a die including a second bonding surface bonded directly to the first bonding surface;

a side recess extending through an entire thickness of the electronic component and into the die;

wherein the side recess defines a recess sidewall extending through the entire thickness of the electronic component and a recess roof within the die; and wherein the recess roof intersects with an outermost lateral sidewall of the die such that the outermost lateral sidewall is exterior to the recess sidewall.

2. The integrated circuit structure of claim 1, wherein the first bonding surface and the second bonding surface are hybrid bonded or fusion bonded together.

3. The integrated circuit structure of claim 2, wherein the die includes:

a semiconductor layer; and a back-end-of-the-line (BEOL) build-up structure on the semiconductor layer;

wherein the recess roof is in the semiconductor layer.

4. The integrated circuit structure of claim 3, further comprising:

a second die including a third bonding surface bonded directly to the first bonding surface; and a gap fill material laterally between the first die and the second die.

5. The integrated circuit structure of claim 4, further comprising:

a second side recess extending through the entire thickness of the electronic component and into the second die;

wherein the second side recess defines a second recess sidewall extending through the entire thickness of the electronic component and a second recess roof within the second die; and wherein the second recess roof intersects with a second outermost lateral sidewall of the second die such the second outermost lateral sidewall is exterior to the second recess sidewall.

6. The integrated circuit structure of claim 5, wherein the second outermost lateral sidewall of the second die is parallel to the outermost lateral sidewall of the first die.

7. The integrated circuit structure of claim 4, further comprising a chiplet including a fourth bonding surface bonded directly to the first bonding surface, wherein the gap fill material is laterally between the chiplet and both the second die and the first die.

8. The integrated circuit structure of claim 7, wherein the side recess does not extend into the chiplet.

9. The integrated circuit structure of claim 8, wherein:

the electronic component comprises a first BEOL build-up structure;

the first BEOL build-up structure includes a first seal ring adjacent to the recess sidewall;

the die includes a second BEOL build-up structure; and the second BEOL build-up structure includes a second seal ring adjacent to the recess sidewall;

wherein the first seal ring extends underneath the chiplet.

10. The integrated circuit structure of claim 4, wherein the die includes one or more chamfered corners, and the side recess does not include a chamfered corner along the outermost lateral sidewall of the die.

11. The integrated circuit structure of claim 10, wherein the die includes a seal ring adjacent to the recess sidewall, wherein the seal ring includes a chamfered corner adjacent to the recess sidewall.

12. The integrated circuit structure of claim 3, further comprising a gap fill material laterally surrounding the die, wherein the side recess extends into the gap fill material, and the recess roof is additionally formed in the gap fill material.

13. The integrated circuit structure of claim 3, wherein the electronic component is selected from the group consisting of a die and an interposer.

14. The integrated circuit structure of claim 1:

further comprising a local cavity extending through the entire thickness of the electronic component and into the die;

wherein the local cavity defines a cavity sidewall extending through the entire thickness of the electronic component and a cavity roof within the die; and wherein the local cavity is completely surrounded by the electronic component and the die.

15. The integrated circuit structure of claim 14, wherein the local cavity is substantially filled with one or more cavity fill material layers.

16. The integrated circuit structure of claim 1, further comprising one or more recess fill material layers substantially filling the side recess.

17. The integrated circuit structure of claim 16, further comprising a liner layer spanning the side recess, the liner layer conformal to a contour and forming an outline along the recess sidewall and recess roof of the side recess, wherein the liner layer is between the one or more recess fill material layers and the side recess.

18. The integrated circuit structure of claim 16, further comprising:

a passivation layer spanning underneath the one or more recess fill material layers and the electronic component; and a plurality of terminals underneath the passivation layer.

19. An electronic module comprising:

a module substrate;

an integrated circuit structure mounted on the module substrate, the integrated circuit structure comprising:

an electronic component including a first bonding surface;

a die including a second bonding surface bonded directly to the first bonding surface;

a side recess extending through an entire thickness of the electronic component and into the die;

wherein the side recess defines a recess sidewall extending through the entire thickness of the electronic component and a recess roof within the die; and wherein the recess roof intersects with an outermost lateral sidewall of the die such that the outermost lateral sidewall is exterior to the recess sidewall.

20. The electronic module of claim 19, further comprising an underfill material between the integrated circuit structure and the module substrate, wherein the underfill material fills the side recess.

21. The electronic module of claim 20, further comprising a gap fill material laterally surrounding the die, wherein the side recess extends into the gap fill material.

22. The electronic module of claim 20, wherein the first bonding surface and the second bonding surface are hybrid bonded or fusion bonded together.

23. The electronic module of claim 20:

further comprising a local cavity extending through the entire thickness of the electronic component and into the die;

wherein the local cavity defines a cavity sidewall extending through the entire thickness of the electronic component and a cavity roof within the die;

wherein the local cavity is completely surrounded by the electronic component and the die; and wherein the underfill material fills the local cavity.

24. The electronic module of claim 19, further comprising:

one or more recess fill material layers substantially filling the side recess; and an underfill material between the integrated circuit structure and the module substrate;

wherein the underfill material does not encroach inside the side recess.

25. The electronic module of claim 19:

further comprising a local cavity extending through the entire thickness of the electronic component and into the die;

an underfill material between the integrated circuit structure and the module substrate;

wherein the local cavity defines a cavity sidewall extending through the entire thickness of the electronic component and a cavity roof within the die;

wherein the local cavity is completely surrounded by the electronic component and the die; and wherein the local cavity is substantially filled with one or more cavity fill material layers, and the underfill material does not encroach inside the local cavity.

26. A method of forming an integrated circuit structure comprising:

directly bonding a die to an electronic component substrate;

encapsulating the die on the electronic component substrate with a gap fill material;

forming a side recess through an entire thickness of the electronic component substrate and into the die, wherein the side recess defines a recess sidewall extending through the entire thickness of the electronic component substrate and a recess roof within the die; and sawing through the side recess to singulate the electronic component, wherein the recess roof intersects with an outermost lateral sidewall of the die such the outermost lateral sidewall is exterior to the recess sidewall.

27. The method of claim 26, wherein forming the side recess comprises laser drilling.

28. The method of claim 27, wherein directly bonding the die to the electronic component substrate comprises hybrid bonding or fusion bonding.

29. The method of claim 26, further comprising depositing one or more recess fill material layers in the side recess prior to sawing through the side recess to singulate the electronic component.

30. An integrated circuit structure comprising:

an electronic component including a first bonding surface;

a die including a second bonding surface bonded directly to the first bonding surface;

a local cavity extending through an entire thickness of the electronic component and into the die;

wherein the local cavity defines a cavity sidewall extending through the entire thickness of the electronic component and a cavity roof within the die; and wherein the local cavity is completely surrounded by the electronic component and the die.

31. The integrated circuit structure of claim 30, wherein the electronic component includes a first seal ring, and the die includes a second seal ring, and the local cavity extends through the electronic component and into the die outside of the first seal ring and the second seal ring.

32. The integrated circuit structure of claim 30, wherein the first bonding surface and the second bonding surface are hybrid bonded or fusion bonded together.

33. The integrated circuit structure of claim 32, wherein the die includes:

a semiconductor layer; and a back-end-of-the-line (BEOL) build-up structure on the semiconductor layer;

wherein the cavity roof is in the semiconductor layer.

34. The integrated circuit structure of claim 30, wherein the local cavity is substantially filled with one or more cavity fill material layers.

* * * * *